US012587202B2

(12) United States Patent
Dempsey et al.

(10) Patent No.: US 12,587,202 B2
(45) Date of Patent: Mar. 24, 2026

(54) CONFIGURABLE DIGITAL-TO-ANALOG CONVERTER CALIBRATION

(71) Applicant: Analog Devices International Unlimited Company, Limerick (IE)

(72) Inventors: Dennis A. Dempsey, Newport (IE); Ken Bryan Fulgosino Fabay, Rizal (PH)

(73) Assignee: Analog Devices International Unlimited Company, Limerick (IE)

( * ) Notice: Subject to any disclaimer, the term of this patent is extended or adjusted under 35 U.S.C. 154(b) by 200 days.

(21) Appl. No.: 18/495,564

(22) Filed: Oct. 26, 2023

(65) Prior Publication Data

US 2025/0141459 A1 May 1, 2025

(51) Int. Cl.
| | |
|---|---|
| *H03M 1/10* | (2006.01) |
| *H03M 1/68* | (2006.01) |
| *H03M 1/76* | (2006.01) |
| *H03M 1/78* | (2006.01) |

(52) U.S. Cl.
CPC ....... *H03M 1/1014* (2013.01); *H03M 1/1009* (2013.01); *H03M 1/1047* (2013.01); *H03M 1/1057* (2013.01); *H03M 1/68* (2013.01); *H03M 1/765* (2013.01); *H03M 1/785* (2013.01)

(58) Field of Classification Search
CPC ............. H03M 1/1014; H03M 1/1057; H03M 1/1047; H03M 1/68; H03M 1/765; H03M 1/785; H03M 1/1009
USPC .......................... 341/120, 121, 144–145, 154
See application file for complete search history.

(56) References Cited

U.S. PATENT DOCUMENTS

| | | | |
|---|---|---|---|
| 5,495,245 | A | 2/1996 | Ashe |
| 5,969,657 | A | 10/1999 | Dempsey et al. |
| 6,414,616 | B1 | 7/2002 | Dempsey |
| 6,445,325 | B1 | 9/2002 | Burns |
| 6,570,517 | B1 | 5/2003 | Geraghty et al. |
| 6,885,328 | B1 | 4/2005 | Kao et al. |
| 7,136,002 | B2 | 11/2006 | Dempsey et al. |

(Continued)

FOREIGN PATENT DOCUMENTS

EP 3624345 A1 3/2020

OTHER PUBLICATIONS

Kennedy, M.P, et al., "The LEMMA developer's toolbox: semi-automated test development for analog and mixed-signal circuits", IEEE International Symposium on Circuits and Systems (ISCAS), Monterey, CA, USA, (1998), 410-413.

(Continued)

*Primary Examiner* — Khai M Nguyen
(74) *Attorney, Agent, or Firm* — Schwegman Lundberg & Woessner, P.A.

(57) ABSTRACT

The present disclosure relates to a digital-to-analog converter comprising an impedance network and a transfer function modification circuit. The transfer function modification circuit comprises a DAC and a demultiplexer. The demultiplexer may be used to selectively connect the output of the DAC to different respective nodes of the impedance network, allowing positive or negative currents to be injected into the node and modify the transfer function. By using a demultiplexer to selectively couple to different nodes, the node into which the current is injected may be modified post-manufacture, allowing transfer function modification.

20 Claims, 15 Drawing Sheets

(56)                    References Cited

U.S. PATENT DOCUMENTS

| | | | |
|---|---|---|---|
| 7,339,508 B2 | 3/2008 | Cosgrave et al. | |
| 7,671,770 B2 | 3/2010 | Tukel | |
| 7,728,807 B2 | 6/2010 | Chia | |
| 8,089,380 B2 * | 1/2012 | McLachlan ......... | H03M 1/1019 |
| | | | 341/120 |
| 9,124,296 B2 | 9/2015 | Dempsey | |
| 9,325,337 B1 | 4/2016 | Dempsey | |
| 9,397,688 B2 | 7/2016 | Shill | |
| 10,574,247 B1 | 2/2020 | Ding et al. | |
| 11,081,034 B2 * | 8/2021 | Yeh .......................... | G09G 3/20 |
| 2003/0132907 A1 | 7/2003 | Lee et al. | |
| 2011/0037630 A1 | 2/2011 | Mclachlan et al. | |

OTHER PUBLICATIONS

Lin, Chi-Hung, et al., "A 10-b, 500-MSample/s CMOS DAC in 0.6 mm2", IEEE Journal of Solid-State Circuits, vol. 33, No. 12, (Dec. 1998), 1948-1958.

Narenda, Siva, et al., "Full-Chip Subthreshold Leakage Power Prediction and Reduction Techniques for Sub-0.18-m CMOS", IEEE Journal of Solid-State Circuits, vol. 39, No. 2, (Feb. 2004), 501-510.

Pelgrom, M, et al., "Matching properties of MOS transistors", IEEE Journal of Solid-State Circuits, vol. 24, No. 5, (Oct. 1989), 1433-1439.

"Chinese Application Serial No. 202411355257.9, Notification to Make Rectification (210302) mailed Nov. 4, 2024", 2 pgs.

"European Application Serial No. 24198604.1, Extended European Search Report mailed Feb. 11, 2025", 12 pgs.

* cited by examiner

700

702 — Select demultiplexer output

704 — Select DAC trim code

706 — Determine residual error

708 — Save configuration to library

710 — Exit condition met?

712 — Apply Configuration

CONFIGURABLE DIGITAL-TO-ANALOG CONVERTER CALIBRATION

TECHNICAL FIELD

The present disclosure relates to an apparatus and method for digital-to-analog conversion. In particular, the disclosure relates to an apparatus and method for digital-to-analog conversion including modification of the transfer function of digital-to-analog converters.

BACKGROUND

Digital-to-analog converters (DACs) convert digital input codes into analog output signals. DACs are widely used in a variety of applications, such as signal processing, control and biasing. DACs commonly include switched resistor or impedance strings. For example, both string and ladder DACs include resistor networks. The resistor network acts as a potential divider, with different voltages being generated at each node along the network. Resistor networks may be operated in voltage or current mode, for voltage and current outputs respectfully. The voltage mode resistor networks are connected to an array of switches, which may be switched on and off to change the voltage that is supplied to the output. The switches are typically controlled by a decoder, which takes an input digital code, and determines which node to connect to the output (for a string DAC) or which node(s) to connect to a voltage reference (for example a voltage mode R-2R DAC) to generate a suitable analog voltage.

An important performance parameter of DACs is accuracy, including non-linearity. Assuming all of the resistors are identical, and that other characteristics of the DAC are ideal, the relationship between the input code and the voltage output should be linear. However, owing to differences between the resistor values, for example due to process variations and resistor tolerances, voltage errors may appear at the nodes. In other words, for a particular input code, the voltage generated is slightly different to the ideal voltage due to resistor variation. The DAC interconnect can also impact the non-linearity and needs to be matched and scaled appropriately if required. Errors may also be present due to other manufacturing variances.

As such, it may be desirable to provide a DAC with improved accuracy.

SUMMARY

The present disclosure relates to a digital-to-analog converter comprising an impedance network and a transfer function modification circuit. The transfer function modification circuit comprises a DAC and a demultiplexer. The demultiplexer may be used to selectively connect the output of the DAC to different respective nodes of the impedance network, allowing positive or negative currents to be injected into the node and modify the transfer function. By using a demultiplexer to selectively couple to different nodes, the node into which the current is injected may be modified post-manufacture, allowing variable transfer function modification.

According to a first aspect of the disclosure, there is provided a digital-to-analog converter, DAC, comprising: an impedance network, comprising a plurality of impedance elements coupled together via a plurality of nodes, wherein the impedance network is configured to be coupled to a reference voltage and to generate a plurality of voltage values at the plurality of nodes; and a transfer function modification circuit, comprising: a trim current DAC, the trim current DAC comprising an input for receiving trim codes and an output; and a demultiplexer, the demultiplexer comprising an input and a plurality of outputs, wherein the output of the trim current DAC is coupled to the input of the demultiplexer, wherein each output of the plurality of outputs of the demultiplexer is coupled to a respective node of the plurality of nodes, and wherein the trim current DAC is configured to modify the transfer function of the DAC by injecting current into, or draining current from, a selected node of the plurality of nodes via a selected output of the demultiplexer.

According to a second aspect of the disclosure, there is provided a digital-to-analog converter, DAC, comprising: an impedance network, comprising a plurality of impedance elements coupled together via a plurality of nodes, wherein the impedance network is configured to be coupled to a reference voltage and to generate a plurality of voltage values at the plurality of nodes; and a transfer function modification circuit, comprising: current injection means, the current injection means configured to be coupled to a subset of the plurality of nodes; wherein the current injection means is configured to modify the transfer function of the DAC by selecting a node of the subset of the plurality of nodes and injecting current into, or draining current from, the selected node of the subset of the plurality of nodes.

According to a third aspect of the disclosure, there is provided a method of modifying the transfer function of a digital-to-analog converter (DAC) comprising an impedance network, the impedance network comprising a plurality of resistor elements coupled together via a plurality of nodes, wherein the impedance network is configured to be coupled to a reference voltage and to generate a plurality of voltage values at the plurality of nodes, the method comprising: selecting a respective node of the plurality of nodes to inject current into, or drain current from; injecting the current into, or draining the current from, the selected node of the impedance string to modify the transfer function of the DAC.

BRIEF DESCRIPTION OF THE DRAWINGS

Aspects of the disclosure will now be described by way of example only and with reference to the accompanying drawings, wherein like reference numerals refer to like parts, and wherein.

3

Figure 8A:
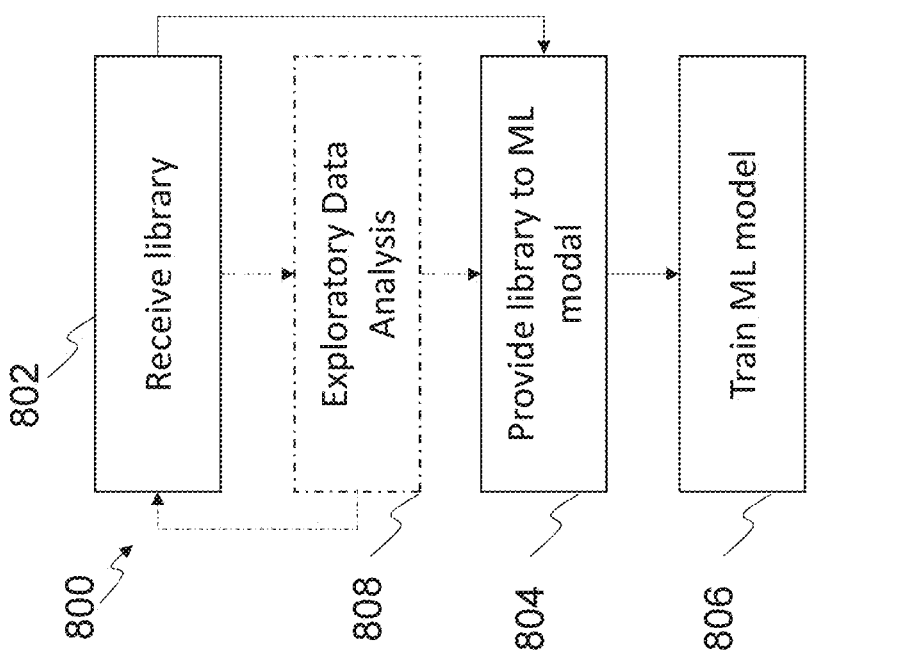
FIG. 8a is a machine learning method for determining a machine learning model in accordance with an example of the present disclosure.
Figure 8B:
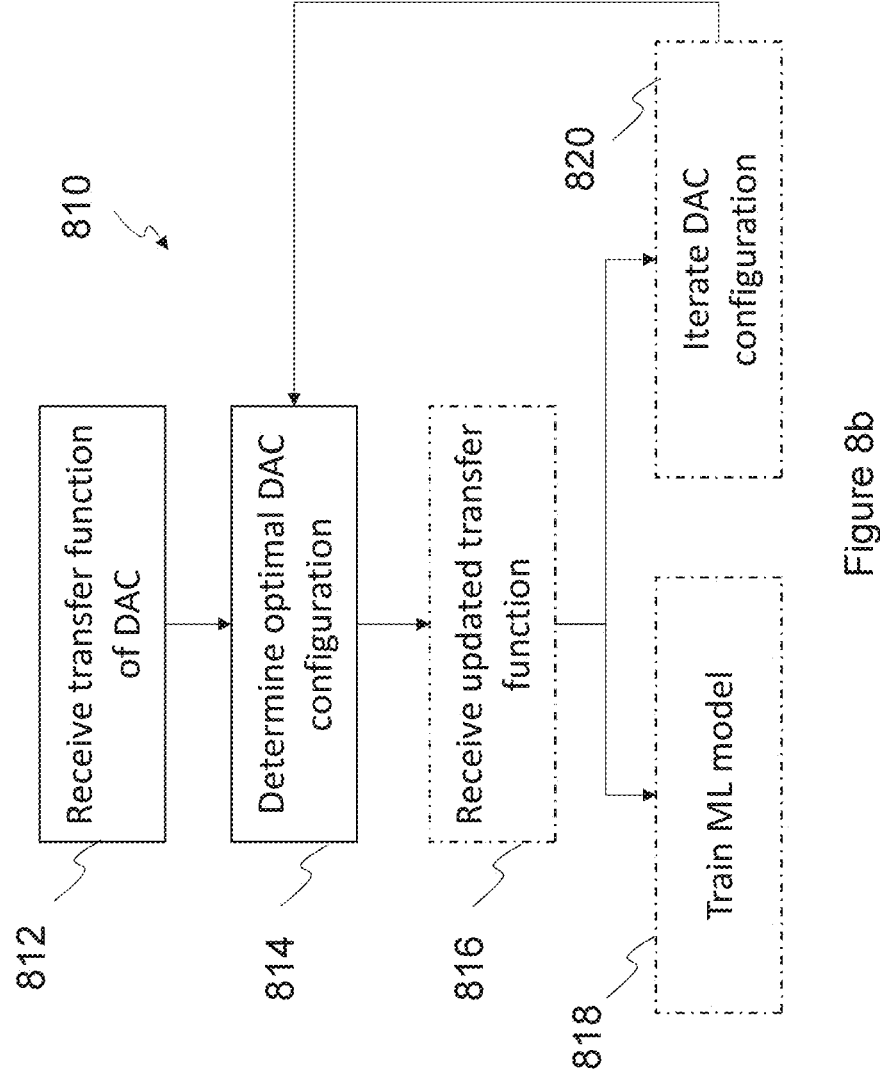
Figure 9:
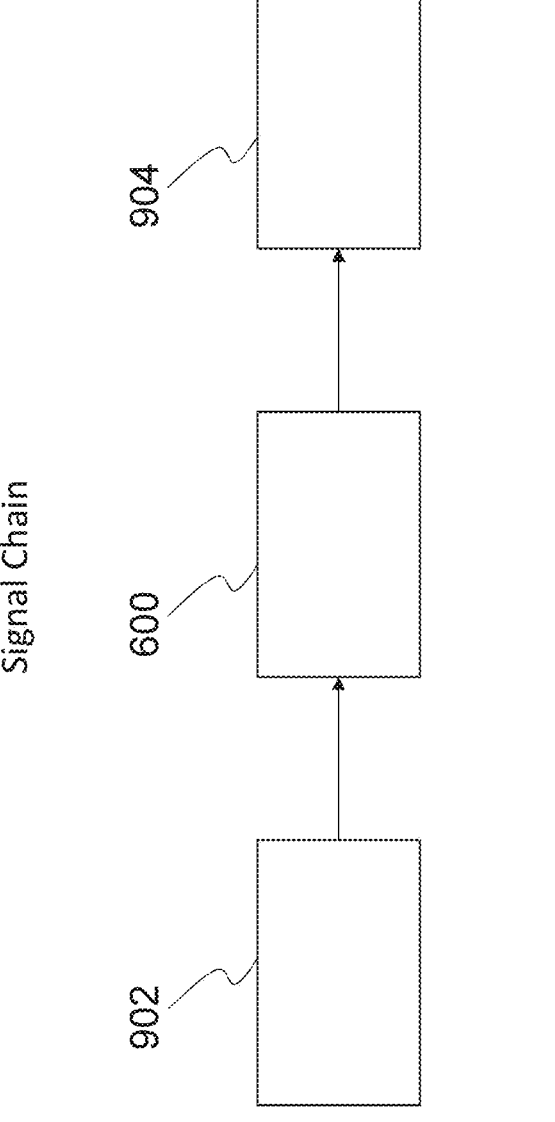
Figure 10:
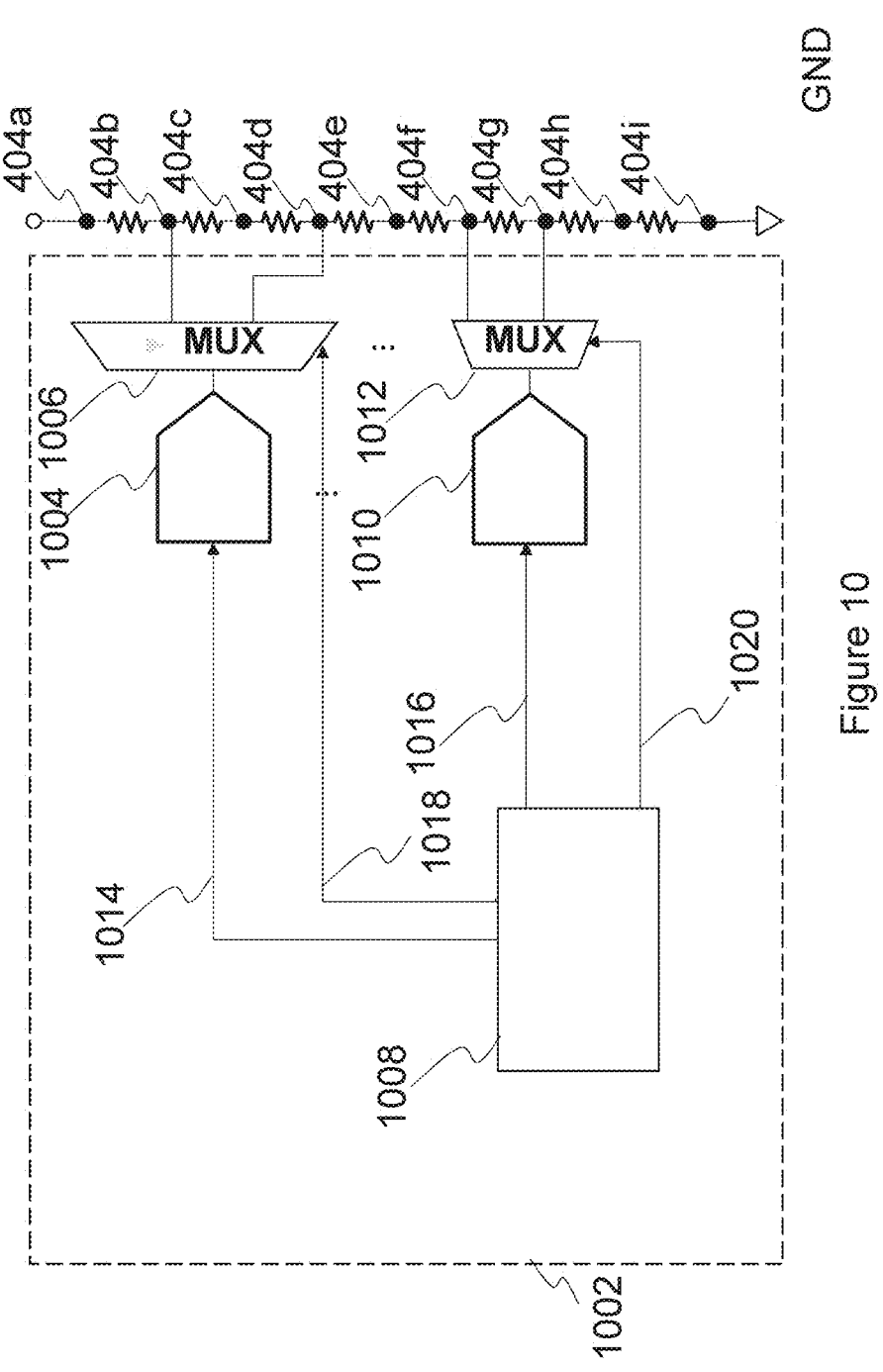
Figure 11:
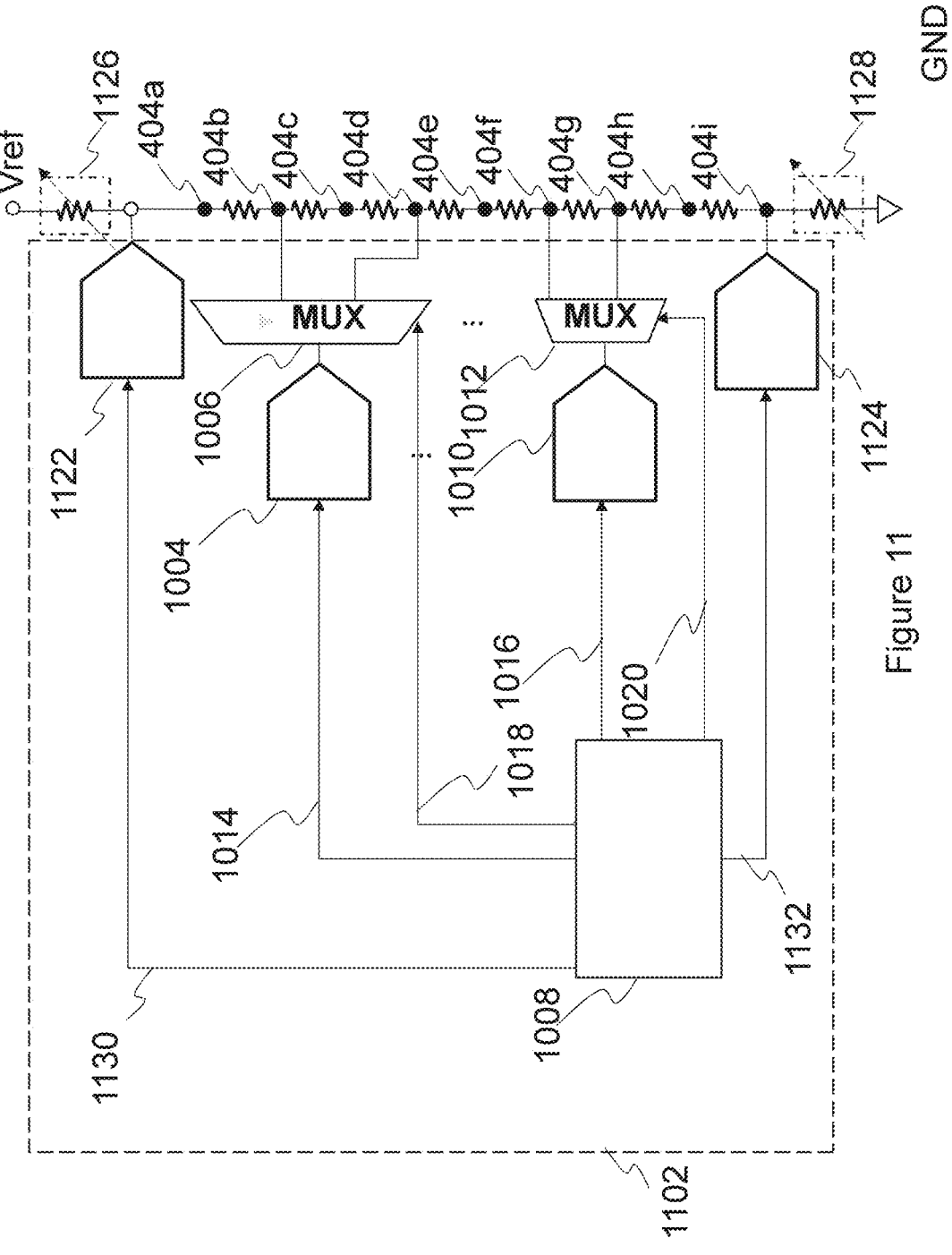
Figure 12:
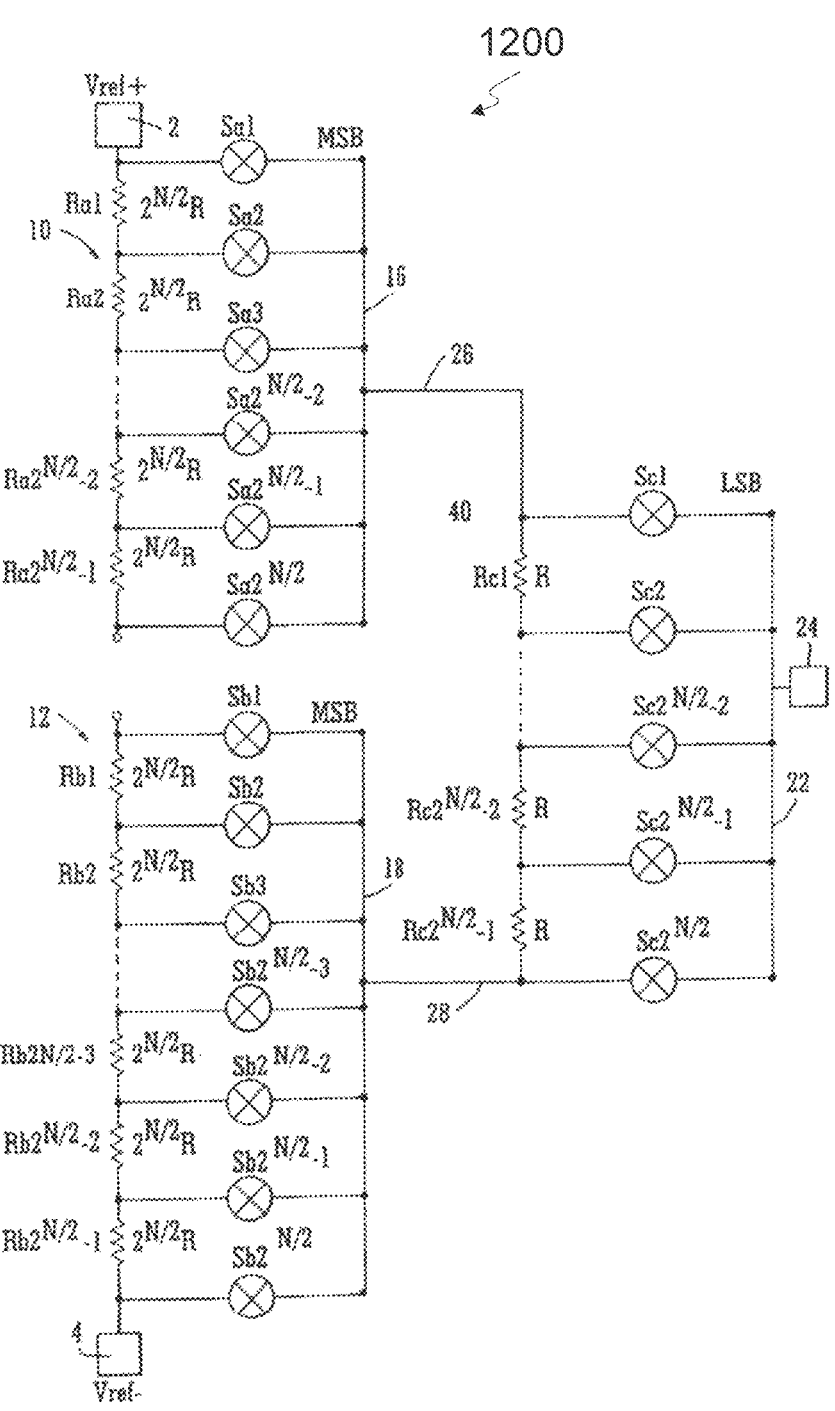
Figure 13:
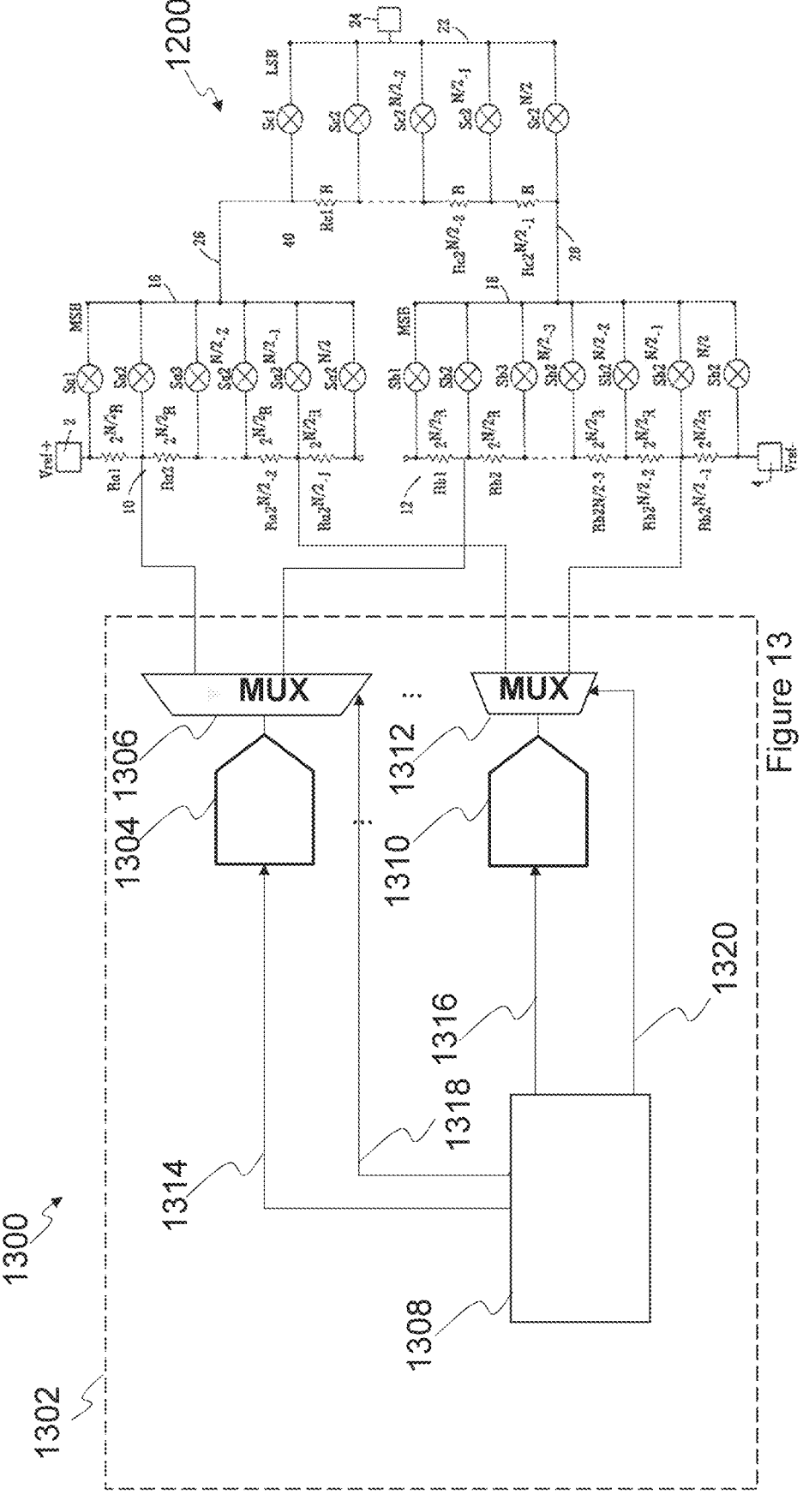

FIG. 8*b* is a method of determining demultiplexer outputs and DAC trim codes using a machine learning model in accordance with an example of the present disclosure;

FIG. 9 is a signal chain including a DAC in accordance with an example of the present disclosure;

FIG. 10 is a representation of a DAC including a plurality of multiplexers and current DACs in accordance with an example of the present disclosure;

FIG. 11 is a second representation of a DAC including a plurality of multiplexers and current DACs in accordance with an example of the present disclosure;

FIG. 12 is a representation of a DAC including multiple impedance networks; and FIG. 13 is a representation of a DAC including multiple impedance networks and a transfer function modification circuit in accordance with an example of the present disclosure.

DETAILED DESCRIPTION

Impedance networks used in DACs typically include a plurality of resistors connected in series between a first voltage reference level and a second voltage reference level. Voltages are generated at each node of the impedance network, with the nodes being between the resistors, and these are used to generate an analog output voltage. Different forms of DAC may use an impedance network that is coupled to only a single reference voltage. A second reference may be provided by a ground, analog ground or 0V level. Alternatively, the DAC may include multiple impedance networks.

Ideally, the unit resistors in the impedance network should all be of the same value, resulting in the voltages at the nodes being evenly distributed along the impedance network. However, DACs have various non-linearities which cause voltage errors appear at the nodes. Non-linearities may be caused by various attributes and manufacturing variations, such as non-ideal resistor values, non-ideal switches, parasitic impedances and layout-dependent effects. Voltage coefficient and voltage coefficient variation can also cause mismatches which lead to non-linearities. Non-linearities may also be introduced by other parts of a signal chain which the DAC is part of. The accuracy or linearity of the DAC can be improved using resistors specified to a greater accuracy. For example, the impedance network may be constructed using thin film resistors. Alternatively, the resistors may be designed to take up a greater area, as resistor accuracy typically increases as the resistor area increases until distance, or gradient, dependent mismatch becomes more dominant.

An alternative way to improve the accuracy of the system is to use a calibration circuit to inject positive or negative currents into respective nodes of the impedance network. A number of current DACs may be connected to certain nodes, with each current DAC receiving an input trim code corresponding to the current it should source or sink from the respective node. The injected currents change the voltages at the nodes. Changing the voltages at the nodes changes the transfer function of the DAC.

DACs are typically part of larger signal chains. The devices or components of the signal chain may be non-linear e.g. due to voltage dependency or other dependencies. The larger signal chain may have a non-linear output caused by both the manufacturing variances of the impedance network of the DAC and non-linearities introduced by other parts of the signal chain, such as pre or post-amplification circuits, or buffers. As such, the currents injected into the nodes of the impedance network may be configured to linearise the signal chain that the DAC is part of, or may be used to linearise the DAC itself.

Including a current DAC connected to every node of the impedance network may be uneconomical, both in terms of the financial cost of including a large number of current DACs, but also in terms of the area used to provide the current DACs. As such, some systems inject current into only a limited number of nodes. For example, where the impedance network is an eight-resistor string, current may be injected into only three of the nodes. The system may therefore include three current DACs, with the output of each current DAC coupled to one of the three nodes.

However, when designing a DAC system using nanometer processes, it can be hard to predict the non-linearities which are introduced by the impedance network. For example, parasitic impedances and across-chip and local layout dependent effects may differ significantly between a simulation of the DAC system and an actual manufactured DAC system. Where multiple instances of the DAC exist in different integrated circuit (IC) locations, they commonly have differing dependencies and differing non-ideal lithographic mask limitations. As such, having a limited number of current injection points (such as three of eight nodes within an eight-resistor string) may provide sub-optimal calibration options.

In this case, providing eight current DACs, with one coupled to each of the eight nodes, would allow improved calibration of the DAC system. However, this would significantly increase the area required to implement the DAC system. It is also not clear how to optimize the choice of nodes with the afore-mentioned effects not predicted accurately in simulation and there's an additional degree of variation when multiple DACs co-exist.

As such, there is a desire to provide a system which allows increased configurability of compensation for an impedance network, such that the compensation can be changed to take into account these less predictable effects including process dependent effects, die location and assembly dependent effects whilst ensuring that the DAC system is still compact.

The present inventor has recognised that one or more demultiplexers may be coupled between the output of a current DAC and a plurality of nodes, allowing the node that current is injected into, or drained from, to be configured post-manufacture. A 'demultiplexer' may be defined as a circuit having a single input signal which chooses one of multiple outputs based on a control signal. Thus, the use of a demultiplexer in the DAC circuit requires substantially less area compared with providing a dedicated current DAC for each node, whilst improving the ability of the system to compensate errors. Further, the use of a demultiplexer in the DAC circuit allows the DAC circuit to be configured in a more flexible way such that non-linearities which cause voltage errors to appear at the nodes may be corrected post-manufacture. The DAC transfer function modification capability provided by the demultiplexing function may be done with different demultiplexer circuit configurations for different die or different DAC instances on the same chip, a new post-fabrication degree of optimization freedom at low cost and with low design effort.

Figure 1:
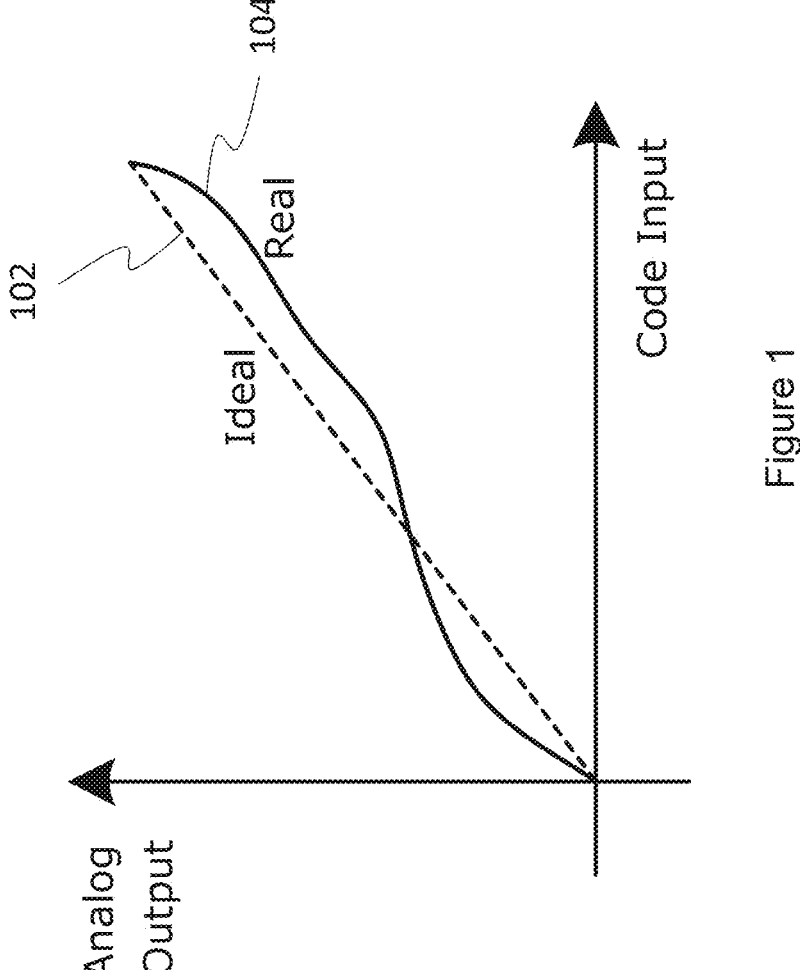
FIG. 1 is an example representation of errors in the analog output of a DAC.

FIG. 1 shows a graph of the ideal DC transfer function performance and an example of the real performance of a DAC. The example is a single-supply or unipolar case with 0V, or ground reference, lower reference level visible at zeroscale code and a positive voltage level resulting in positive output fullscale voltage level. DACs may be used to convert signals in industrial, instrumentation, consumer, healthcare, amperometry, voltammetry, audio and visual applications. A DAC receives a digital input. Ideally, the analog output of the DAC should be proportional to the code input, or digital input of the DAC. The ideal output is shown by line 102 of FIG. 1. However, due to non-linearities in the system, such as non-ideal resistor attributes and various manufacturing systematic error and variations (non-ideal resistor values, non-ideal switches, parasitic impedances and layout-dependent effects), the analog output of the DAC may not follow a linear relationship with the code input of the DAC. This is shown by the example of the real response 104 of the DAC. The graph of FIG. 1a relates to a unipolar DAC, where the output of the DAC is always positive, however bipolar DACs, where the output can be positive or negative, may also show a similar difference between the ideal and real responses.

Various DAC types use impedance networks formed of a plurality of resistors connected together in a string. These impedance networks include a plurality of nodes, with each node capable of providing a different voltage output. For example, both string DACs and ladder DACs use resistor networks to provide an analog output. R/2R DACs are an example of ladder networks.

The response shown in FIG. 1 is a simplified response, in that the relationship between he code input and analog output appears continuously linear. However, in reality the response of the DAC is stepped, or quantized by the DAC resolution, in that a step change in the code input causes a step change in the analog output.

Figure 2A:
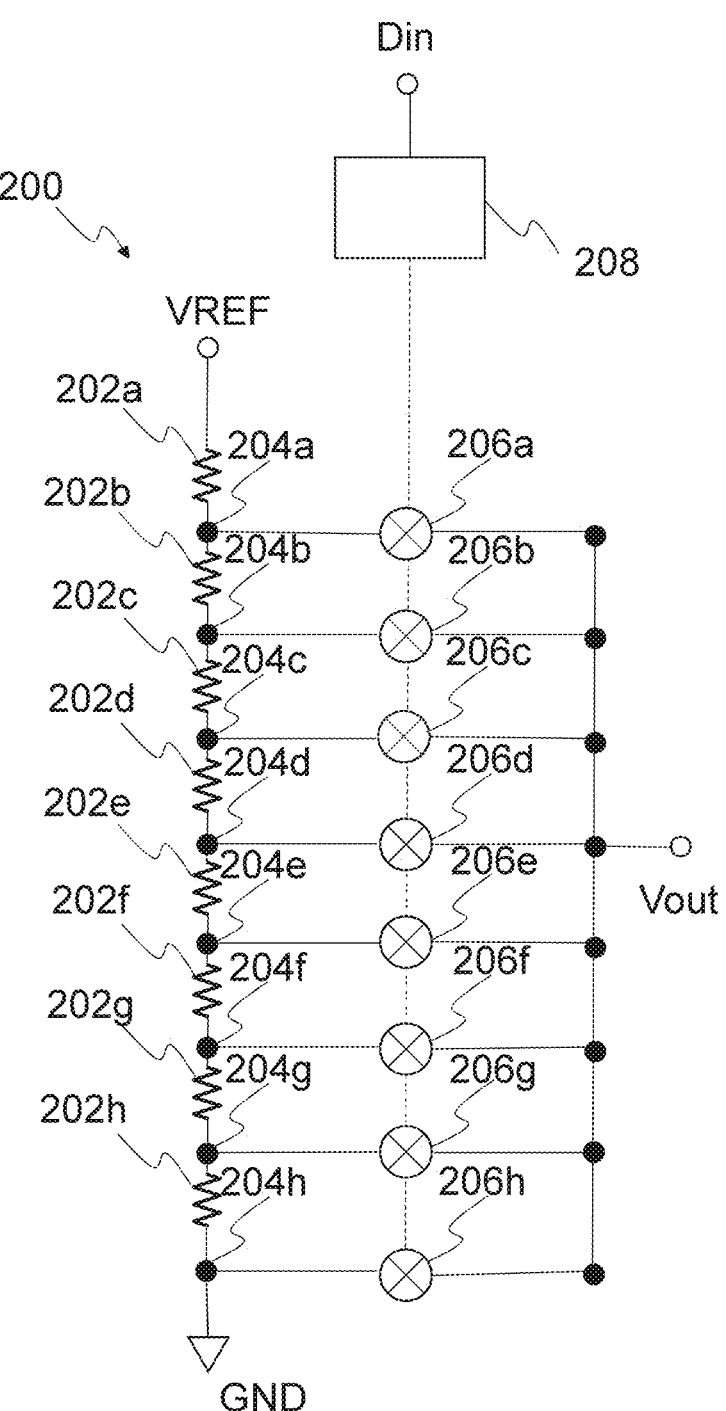
FIG. 2a is a representation of a string DAC.

FIG. 2a shows a digital-to-analog converter (DAC) 200. DAC 200 is a string DAC that includes an impedance network. In this example, the impedance network includes a plurality of resistors 202a-202h. However, in alternative embodiments, the impedance network may be an impedance string comprising active devices such as field effect transistors (FETs). For the purposes of this disclosure, each figure will be described in the context of resistor networks, however, it will be appreciated that other types of impedance could be used in place of resistors. As such, the impedance network may be viewed as a plurality of impedance elements coupled together at a plurality of nodes. Parasitic interconnect between impedances may also be considered as a sub-part of the unit impedances. Furthermore, while the present embodiment is described in the context of a single-stage DAC, it will be appreciated that the disclosure may also be applied to multistage DACs, as well as multichannel, multistage DACs.

The impedance network includes eight resistors 202A to 202H connected in series. The DAC of FIG. 2a DAC is arranged to provide $2^N$ output voltages, where N=3. One end of the impedance network is coupled to a first voltage reference VREF, and the other end is connected to a second voltage reference, ground in this case. Whilst the impedance network is shown as being connected to ground, it is clear that this may take the form of a second voltage reference rather than ground. In an ideal case, each resistor takes the same value, and during operation the device operates in a linear manner. However, owing to manufacturing tolerances, the resistors 202A to 202H are not always identical, and systematic and random non-linearities may be introduced during manufacture. The resistors 202a-202h are coupled together via a plurality of nodes 204a-204h. If all the resistors took the same value, the voltages at each of the nodes 204a-204h would be evenly distributed between the reference voltage and ground. The resistors and surrounding circuitry will include various parasitic elements, such as the resistance of the interconnect between the resistors. Further, this assumes that the resistors have zero voltage coefficients (both voltage across the resistor terminals and the common-mode voltage). For the voltages to be evenly distributed throughout the impedance network, these effects must also be considered. As such, it is difficult to provide a linear DAC through passive means.

The DAC 200 also includes a plurality of switches 206a to 206h. Each switch is coupled to a node on the impedance network. At the ends of the impedance network, the switches are coupled between the end resistors 202a and 202h, and VREF and ground respectively. The remaining switches are connected to nodes between two serially coupled resistors. Each of the switches is then coupled to an output VOUT. The switches 206a to 206h are controlled by decoder 208. Decoder 208 is connected to a digital input which provides a digital code DIN. Whilst the DAC includes only a single set of switches, where the system is arranged to provide a differential output or is a multi-string architecture which includes multiple impedance networks, differential outputs may be selected and two switches may be turned on to provide the differential outputs.

The impedance network acts as a voltage divider with different voltages being generated at each node 204a-204i on the network. By connecting one of these nodes to $V_{OUT}$ using one of the switches 206a-206h, an analog output voltage is generated. The decoder 108 determines which switch to enable based on the digital code $D_{IN}$.

As described with respect to FIG. 1, it is generally desirable for there to be a linear relationship 102 between the input digital code Din and the analog output voltage Vout. Typically, it is additionally or alternatively desirable for there to be a linear relationship between the input and output of a signal chain which the DAC is part of. In other words, the transfer function of the DAC should be linear, or the transfer function of the signal chain which contains the DAC should be linear. However, a real DAC introduces non-linearity, for example, owing to manufacturing tolerances. In a DAC, non-linearity may be exhibited as differential non-linearity (DNL) error and integral non-linearity (INL) error. DNL and INL are endpoint adjusted errors and do not include or describe zeroscale or fullscale errors, which may also be described by offset and gain errors. Errors in the DAC may be represented as voltage errors at each of the plurality of nodes 204a-204i in the impedance network.

In addition to providing a linear transfer function, it may be desired to modify the transfer function of a DAC so that the relationship between the input code DIN and the analog output voltage VOUT is designed to be non-linear and follow a particular characteristic curve. This may be used to linearise a different part of a system that the DAC 200 is included in, for example to ensure that the whole signal chain has a linear output.

Figure 2B:
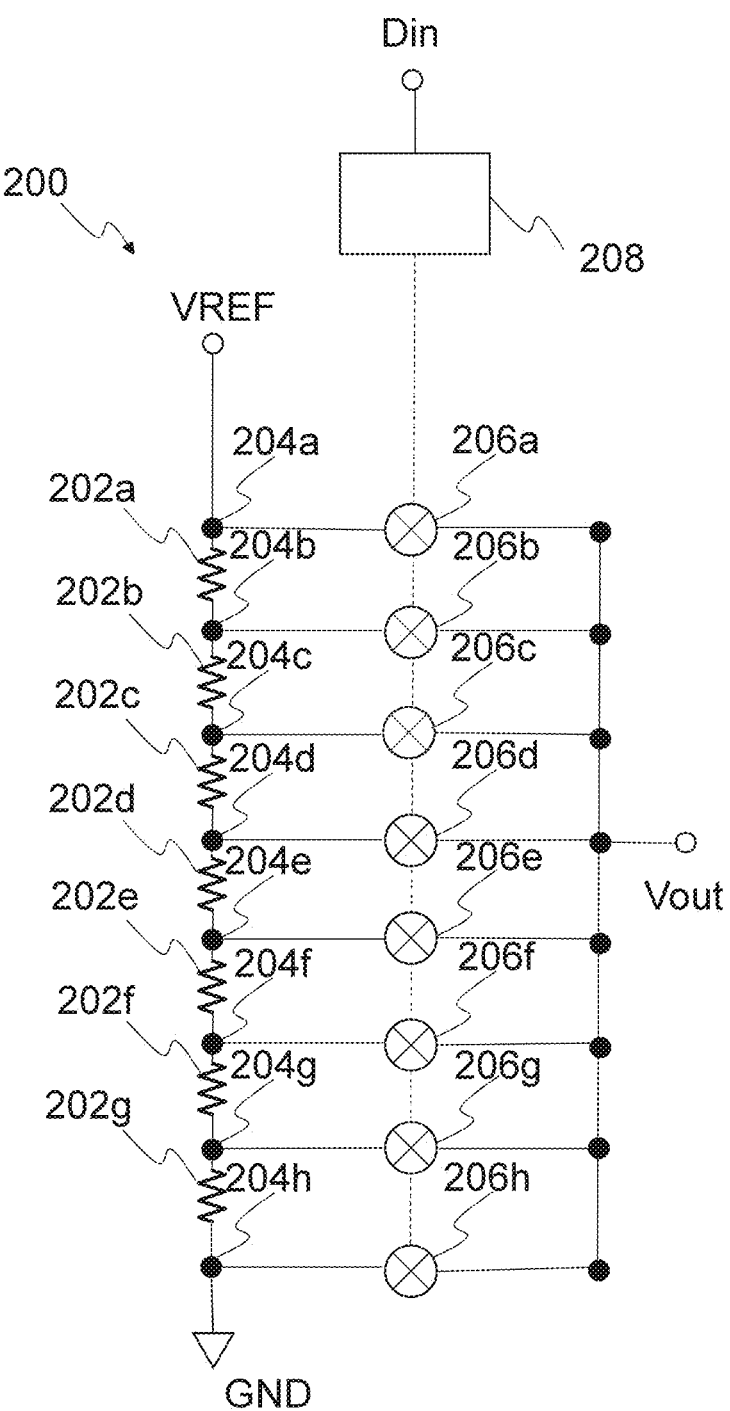
FIG. 2b is a second representation of a string DAC.

FIG. 2b shows an alternative string DAC. The string DAC of FIG. 2b includes $2^N-1$ resistors coupled in series. The operation of the string DAC of FIG. 2b is similar to that of FIG. 2a. All resistor terminals in the string are coupled to the output, compared to the system of FIG. 2a where one terminal of the resistor 202a is not coupled to the output. The number of resistors in the string may differ depending on the coding scheme of the digital input.

Figure 3:
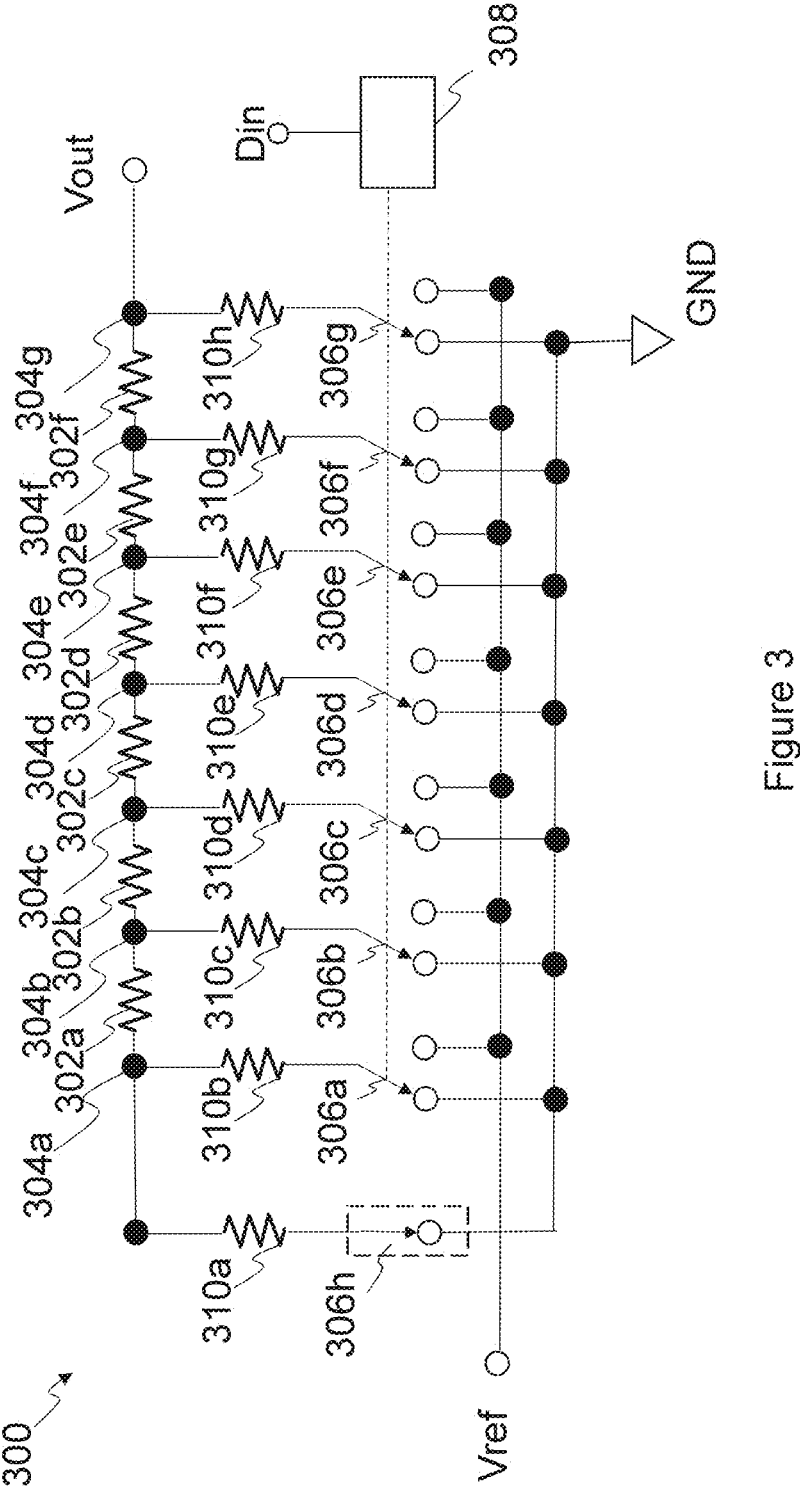
FIG. 3 is a representation of a ladder DAC.

FIG. 3 shows a digital-to-analog converter (DAC) 300. DAC 300 is a ladder DAC that includes an impedance network, and more specifically an R-2R DAC. The R-2R DAC includes an impedance network including a first plurality of resistors 302a-302f. The resistors 302a-302h are coupled together in series via a plurality of nodes 304a-304h. The impedance network including a second plurality of resistors 310a-310h. The nominal values of 302a-302f and 310a-310f are scaled to each other e.g. 310a-310f may be of value 2R in comparison to 302a-302f of value R in a binary scaled R-2R DAC and the resistors are implemented using unit R resistors, known to those skilled in the art. The second plurality of resistors 310a-310h are coupled between a node of the plurality of nodes 304a-304h and a switch of a plurality of switches 306a-306g. A variant of this architecture uses multiple parallel instances of 310h and 306g as a unary scaled network to provide additional DAC resolution and reduce the DNL sensitivity of the architecture.

The switches 306a are arranged to couple the second plurality of resistors 310a-310h, and thus the plurality of nodes 304a-304g, between either a reference voltage or ground. As noted with respect to the DAC of FIG. 2a, ground may instead be replaced by a second reference voltage or terminal.

The impedance network acts as a voltage divider with different voltages being generated at the output node depending on how the switches 310a-310h are coupled. By connecting one of these nodes to $V_{ref}$ using one of the switches 310a-310h, an analog output voltage is generated at Vout. The decoder 308 determines which switch couples to the reference voltage based on a digital code $D_{IN}$ received by the decoder 308.

The resistor 310a of the DAC 300 is shown coupled to ground or the second reference voltage via a switch 306h. This is typical in the design of R-2R DACs, and the switch 310a is permanently closed. Alternatively, this switch 306h may be omitted and the resistor 310a may be coupled directly to ground.

As with the DAC 200, voltage errors can occur at the nodes 304a-304g due to non-linearities, for example, owing to manufacturing variations, in the system.

Both the DAC 200 and the DAC 300 comprise impedance networks comprising pluralities of resistors connected in series. Both DACs suffer from the same errors introduced by manufacturing tolerances, and these errors appear at the plurality of 204a-204i of DAC 200 or at the plurality of nodes 302a-302f of DAC 300. As such, the errors may be considered to appear at nodes connecting a plurality of series coupled resistors or impedance elements.

Other types of DACs which include impedance networks may also suffer from the same voltage errors appearing at nodes of the impedance network. For example, interpolating DACs may also benefit from the transfer function modification circuits set out below. Further, DACs which include multiple stages may be used. For example, a DAC which comprises a first stage including an impedance network and a second stage including a switched capacitor network may be used.

Figure 4:
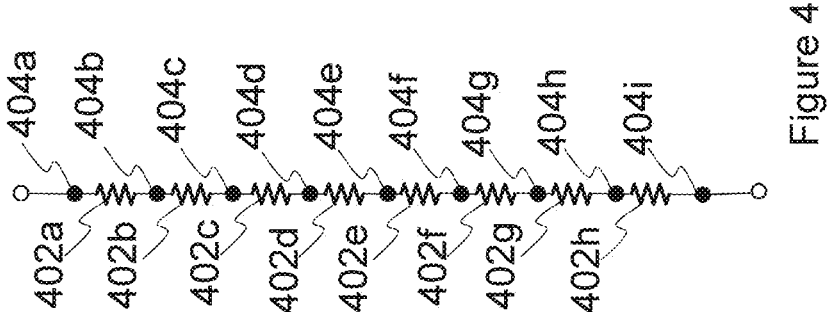
FIG. 4 is a representation of an impedance network used in DACs.

FIG. 4 shows a simplified impedance network, comprising a plurality of resistor elements 402a-402h coupled together via a plurality of nodes 404a-404i. When connected as part of a DAC, such as a string DAC or a ladder DAC, the impedance network generates a plurality of voltage values at the plurality of nodes 404a-404i. In a DAC, errors manifest themselves as voltage errors at one or more nodes of the plurality of nodes 404a-404i. The voltage error is the difference between the desired or target voltage at a particular node, and the voltage achieved in a real circuit. These errors occur in both string and ladder DACs and can be significant for DAC resolutions of greater than eight bits. As noted, the desired voltage at a node may be a voltage to achieve a linear transfer function or may be some other voltage to achieve or approximate a desired transfer function. The number of resistors shown in FIG. 4 and the following figures should be taken as an example only, with the number of resistors used depending on the DAC implementation. For example, the impedance network may include $2^N$ resistors, $2^N-1$ resistors, where N is length of the binary digital input. Any other number of resistors may be used in the impedance network.

A calibration circuit may be used to modify the transfer function of the DAC by injecting current into or draining current from one or more of the nodes. Typically, current would be injected into more than one of the nodes, as this allows greater control over the modification of the voltages throughout the impedance network, and thus the transfer function of the system.

Figure 5:
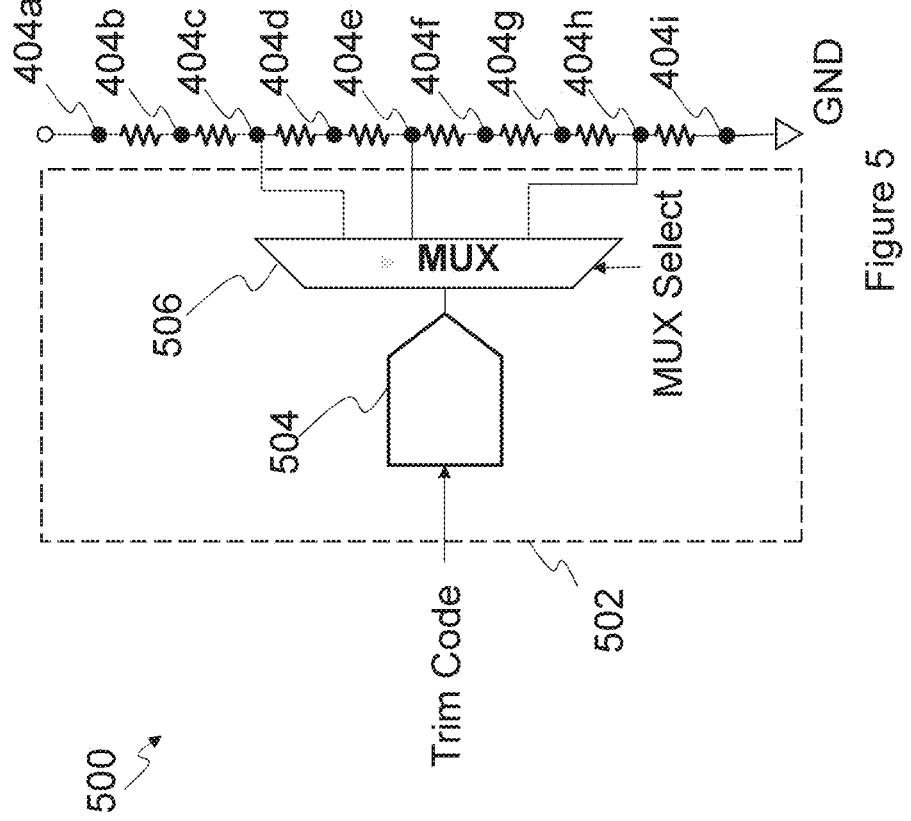
FIG. 5 is a representation of a DAC including a transfer function modification circuit in accordance with an example of the present disclosure.

FIG. 5 shows a DAC 500 including an impedance network and a transfer function modification circuit 502.

The transfer function modification circuit 502 includes a current DAC 504 and a demultiplexer 506. The current DAC 504 is configured to receive a trim code and output a current based on the trim code. The current output by the current DAC 504 may be a positive or negative current, and as such the current DAC 504 may be considered to be a current source or a current sink depending on the received trim code. The trim code supplied to the DAC may be a coded trim code, for example encoded in standard binary, ones complement binary, twos complement binary or minimum change coding, which includes gray coding.

The output of the current DAC 504 is coupled to a demultiplexer 506. A demultiplexer 506 is a form of multiplexer which includes a single input and multiple outputs. As such, the demultiplexer 506 may instead be referred to as a single input multiple output multiplexer. The demultiplexer 506 is configured to receive the output of the DAC 504. The demultiplexer 506 outputs the received signal to a respective output of the demultiplexer 506. The output is selected based on the value of a select signal received by the demultiplexer 506.

Each output of the demultiplexer 506 is coupled to a respective node of the plurality of nodes of the impedance network. The demultiplexer 506 shown in DAC 500 is coupled to three nodes of the plurality of nodes, however this is just one example and the demultiplexer 506 may be coupled to any number of the plurality of nodes. The demultiplexer 506 may have two or more outputs coupled to two or more respective nodes of the plurality of nodes 404a-404i. The system may also include multiple demultiplexers, and the demultiplexers outputs may also couple to common nodes, such that each demultiplexer is coupled to at least one node that another demultiplexer is coupled to. The node sets of one demultiplexer may also overlap the set of notes of a second multiplexer; the range of the sets of nodes do not require to be independent.

As shown in FIG. 5, a first output of the demultiplexer 506 is coupled to node 404c, a second output of the demultiplexer is coupled to node 404e and a third output of the demultiplexer is coupled to node 404h. The demultiplexer does not have to be connected to every node of the plurality of nodes 404a-404i, and there may be more than one resistor coupled between the nodes the demultiplexer is connected to. For example, there are two resistors between the nodes 404c and node 404e. The demultiplexer 506 is not coupled to node 404d.

During operation, the demultiplexer 506 is configured to output via one of its outputs to one of the plurality of nodes. This results in a current being supplied to or drained from one of the nodes 404c, 404e, 404h. This changes the voltage at the respective node, and at all other nodes due to the connection of the resistors. This changes the transfer function of the DAC circuit 500 by changing the voltages at each of the nodes. As such, the errors in the DAC can be desirably reduced or removed.

Whilst the demultiplexer included in FIG. 5 is represented as a single demultiplexer, a plurality of demultiplexers may be coupled to the same DAC. This may allow a current to be injected into multiple nodes of the impedance network.

Whilst injecting a current into a single node may change the voltage at that node, where currents are injected into multiple nodes the voltage at one of those nodes may not significantly or substantially change. This is because the injected currents at the multiple nodes interact to provide an overall change in the transfer function of the impedance network. The voltage at a node is not affected by only a current injected into that node, but also by the currents injected into any other nodes of the impedance network.

The demultiplexer 506 may be implemented by cascading multiplexers and/or row/column decode multiplexer variations.

The DAC 500 shown in FIG. 5 includes eight resistors in an impedance network. Coupling a separate DAC to each node would provide improved configurability, as more of the nodes could be adjusted or calibrated. In a DAC including nine nodes, nine DACs would be required to couple to every node. However, typically a DAC will include a much larger impedance network made up of a greater number of resistors. For example, a string DAC which is configured to receive an N bit binary digital input word may require $2^N-1$ nodes between serially coupled resistors, with each node separated by at least one resistor. This is because the impedance network must provide $2^N$ different output voltages to represent the $2^N$ possible inputs of a conventional binary-encoded DAC implementation. An eight-bit DAC may require 256 impedance elements with 256 nodes including the bottom terminal and 255 nodes between each resistor, with each node separated by at least one resistor. Although not entirely conventional, a string may also be implemented using $2^N-1$, or 255 resistors in this case, with all resistor terminals coupled to the output as shown in FIG. 2*b*. The number of resistors in the string may differ depending on the coding scheme of the digital input. Providing a separate DAC coupled to each of the 256 nodes would un-desirably require a very large circuit. Providing a DAC coupled to each of a subset of nodes, such as 20 nodes, would also require a large circuit size. As such, it is necessary to provide, or couple, the circuit calibration DACs at, or to, a limited number of nodes. The inventor realised that providing a multiplexer allows for DAC specific optimization which can make the DAC calibration achieved by the calibration, or trim, DACs more effective by enabling selection of the optimum nodes as a device specific choice.

When the DAC is manufactured using a nanometer process, there may be large variations between DACs made to the same design, due to deficiencies in the predictability of mismatch and parasitic effects, including mask effects, at these process sizes. Therefore, providing calibration at a limited number of nodes may not allow sufficient calibration to provide a desired level of accuracy at the target circuit area.

Providing a system which includes a demultiplexer 506 between the output of a current DAC 504 and the plurality of impedance network nodes 404*a*-404*i* allows the point at which a current is injected or drained to be modified post-manufacture, without requiring a large circuit area. This allows the calibration to be configured during use without the need for a large number of DACs. This is provided in the DAC 500 shown in FIG. 5, as the node which a current is injected into or drained from can be modified using the multiplexer post-manufacture. During operation, the system selects a node of the plurality of nodes to inject current into or drain current from. The current which is injected into or drained from this node modifies the transfer function of the DAC. Providing a system in which the node into which current is injected or drained is selectable enables extensive control over the transfer function of the DAC.

Figure 6:
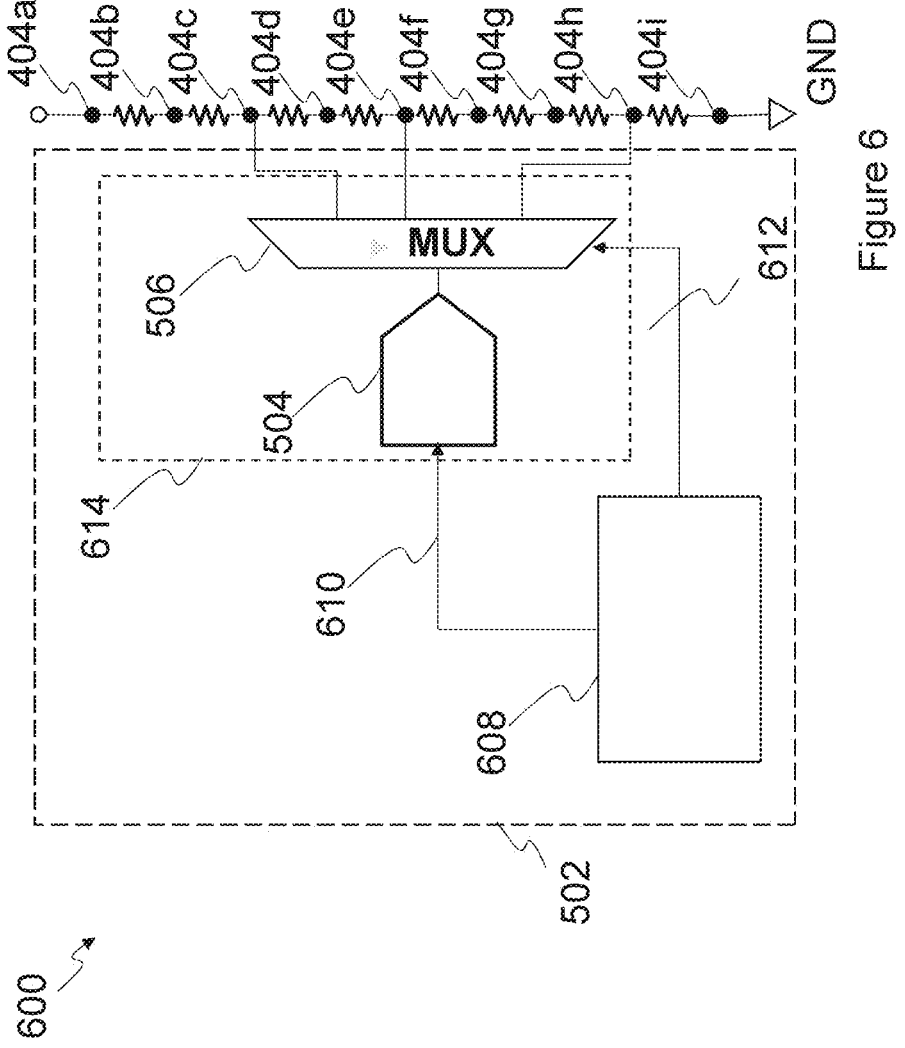
FIG. 6 is a representation of a DAC including calibration circuitry in accordance with an example of the present disclosure.

FIG. 6 shows a DAC 600 similar to the DAC 500. The transfer function modification circuit 502 further includes calibration circuitry 608. The calibration circuitry 608 provides a trim code 610 to the current DAC 504 and a multiplexer select signal 612 to the demultiplexer 506.

The trim current DAC 504 and demultiplexer 506 may be separate components, as shown in FIG. 6. However, alternatively the functions of the trim current DAC and demultiplexer may be provided by a single circuit. Current injection means 614 may combine the functions of both trim current DAC 504 and demultiplexer 506. The current injection means may receive a trim code 610 and an output select signal 612. By combining the functionality of the trim current DAC 504 and the demultiplexer 506, the size of the circuit may be reduced. It may also be desirable to keep them separated to optimize and implement the DAC circuitry separated from the switching circuitry.

The calibration circuitry 608 may include a control system configured to determine the value of the trim code 610 and the multiplexer select signal 612. The trim code 610 sets the value of current that the current DAC 504 is configure to source or sink. The multiplexer select signal 612 sets the output that the demultiplexer 506 is configured to output to. The control system may include a memory configured to store a library of trim codes and multiplexer select signals 612 that may be used. This data may be compressed or transformed digitally, known to those skilled in the art. If compressed, lossless compression is generally preferred both for accuracy and data quality retention.

The control system may be configured to determine the trim codes for the DACs and selected output of the multiplexers using one of a plurality of different methods.

Figure 7:
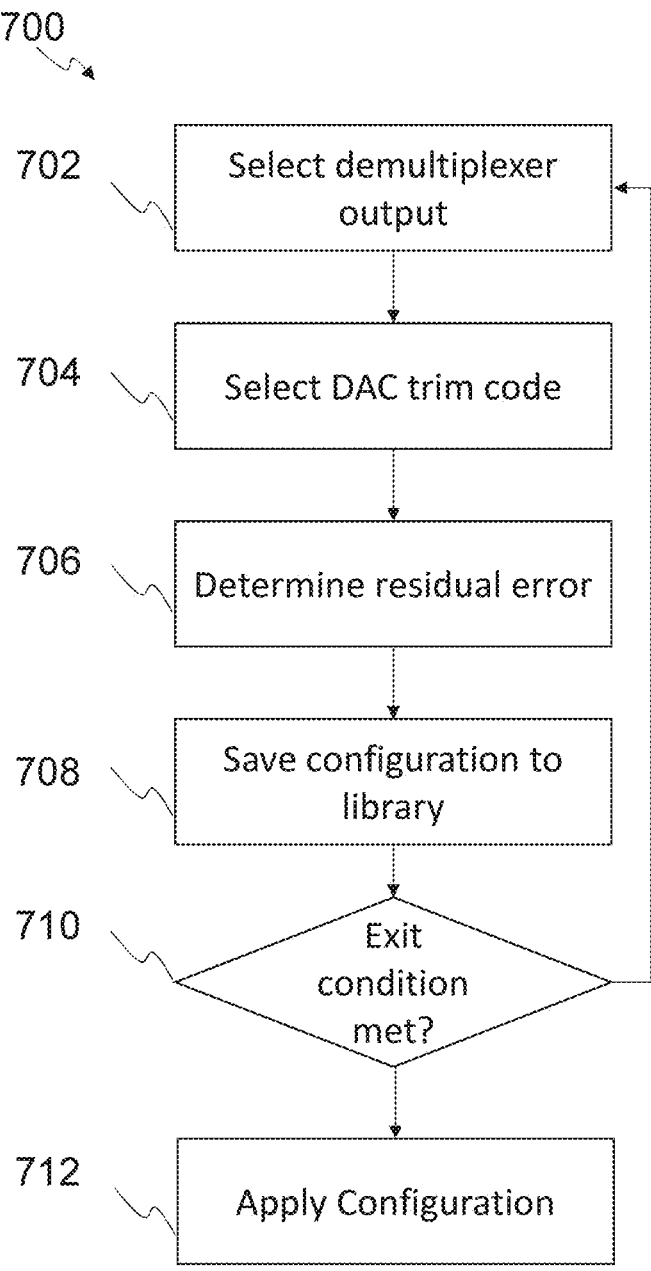
FIG. 7 is method of determining demultiplexer outputs and DAC trim codes in accordance with an example of the present disclosure.

FIG. 7 shows a method that may be performed by the control system to determine the trim code for the DAC 504 and selected output of the demultiplexer 506. The method may comprise testing a plurality of configurations of trim code and demultiplexer output. Where the current DAC and the demultiplexer are provided as a single system, as in the current injection means 614, the system may determine a trim code and a node of the plurality of nodes into which a current should be injected into or drained from.

In a first step 702, the control system selects a demultiplexer 506 output. The control system provides the select signal 612 to the demultiplexer 504. Selecting a demultiplexer output may also be considered to be selecting a configuration of the demultiplexer or selecting a demultiplexer selection.

In a second step 704, the control system selects a trim code for the DAC 504. The control system provides the trim code to the DAC 504. Selecting a trim code for the DAC may also be considered to be selecting a current magnitude which is injected or drained using the current DAC.

The first step 702 and the second step 704 may take place at the same, or in any order. By selecting the trim code and the demultiplexer output, the DAC system selects a respective node of the plurality of nodes to inject current into or drain current from. The trim code and the demultiplexer output may be considered to be a DAC configuration, in that they configure how the transfer function modification operates. Whilst steps 702 and 704 are defined as separate steps, they may be considered as one step—i.e. selecting the node into which a current of a certain magnitude is injected or drained. Where the trim current DAC 504 and demultiplexer are provided as a single system or circuit, such as the current injection means 614, steps 702 and 704 may comprise determining a node into which the current is to be injected or drained and the magnitude of the current.

The demultiplexer 506 output and the trim code may be selected by the control system from a data library of demultiplexer 506 outputs and corresponding trim codes stored in a memory of the control system. The data library may be prepopulated with DAC configurations, including demultiplexer 506 outputs and trim codes, during manufacture of the DAC 600. For example, testing of a large number of DACs 600 may determine that a subset of configurations provide the lowest residual error for the system or a sufficiently low residual error. These may be stored in the library. The data library may be populated using pre-production characterisation and/or yield analysis data. The library may also be added to on an on-going basis to continue learning and reducing the residual error if/as desired. Federated learning may be used.

Once the demultiplexer 506 output and current DAC 504 trim code have been selected by the control system and applied to the current DAC 504 and demultiplexer 506, the control system may determine a residual error of the DAC 600 in step 706. The residual error may be a difference between the ideal output for a digital code input of the DAC 600 and an analog output of the DAC 600. As such, the control system may receive the digital input and analog output and calculate the residual error. Alternatively, the residual error may be the difference between a transfer function of the DAC 600 and a desired transfer function of the DAC 600. The transfer function may be determined based on the digital inputs and analog outputs received by the control system. The system may determine residual error using an on-chip measurement system which is part of the DAC or an off-chip measurement system which is not part of the DAC. The residual error is determined to an accuracy level dependent on the accuracy of the measurement system. As such, multiple DAC configurations may appear to have the same residual error, in that the difference between the tested residual errors is less than a system noise or repeatability threshold.

Where the measurement system is an on-chip system, the chip may comprise an ADC. Where the measurement system is off-chip, the measurement system may be a digital voltmeter or use an ADC.

In step 708, the control system may save the residual error of the DAC 600 configuration to the library, associating the residual error with the tested DAC 600 configuration.

In step 710, the control system may determine whether to test a further DAC configuration or exit the process. For example, where the residual error of the most recently tested DAC 600 configuration is within the target error tolerance of the system, the control system may move to step 712. This allows the system to apply a configuration in step 712 to the DAC 600 that meets a residual error condition as soon as the configuration is determined, providing a faster DAC 600 calibration.

Alternatively, the control system may repeat the process of steps 702-708 until all, or sufficient number, of the DAC configurations stored in the data library have been tested. This may be determined by assessing the effectiveness of the calibration and ensuring that the system has been checked on a sufficient representative number of cases to ensure manufacturability. Once all DAC 600 configurations have been tested, the system may proceed to step 712 and apply the DAC configuration which provides the lowest residual error of the tested DAC configurations. Alternatively, a sufficient number of DAC configurations may be tested such that a sufficiently low residual error is achieved, such as a residual error below a residual error threshold. Where multiple configurations appear to provide the same residual error, for example due to the accuracy to which the residual error is determined, a random one of the configurations may be selected.

While the method 700 characterises the performance of the DAC in varying configurations, it may be desirable to initially measure the DAC and determine the residual error with no trim currents injected. The method 700 may then continue by applying various trim currents to different nodes of the impedance network, and check the that the different nodes meet an anticipated current injection accuracy compared to the case where no current is injected, within measurement repeatability limits. It is desirable to design the trim DACs to sufficiently high accuracy such that their errors do not need to be checked before system calibration but if the trim DACs are not sufficiently accurate, such that the injected current is different than anticipated, then the trim DACs inaccuracy may be measured and taken into account when determining the residual error and injected currents. In the latter case, the constancy or stability of the inaccuracy post-calibration is still important to achieve accurate calibration robust to environment and use case variations. The calibration method 700 may be iterated to account for these inaccuracies.

Before or after the configuration is applied to the transfer function modification circuit in step 712, the configuration may be saved as a preferred configuration in a memory of the control system. The memory may be non-volatile memory. This preferred configuration may be applied in future digital to analog conversions, without the need to repeat the process of method 700.

FIG. 8_a_ shows an alternative method to determine a DAC configuration including a trim code for the current DAC 504 and select signal for the demultiplexer 506.

Step 802 comprises accessing or receiving a data or information library. The data or information library may comprise characterisations of a number of DACs, such as the transfer functions of a number of DACs. The data or information library may also comprise a plurality of previously tested DAC configurations or historic DAC configurations. These may include the initial or uncorrected transfer function of the DAC, a tested DAC configuration applied to the DAC (including the trim code and demultiplexer output applied to a DAC), and the transfer function of the DAC resulting from the transfer function modification. In some cases, a user may pre-calibrate or perform some level of DAC, DAC signal chain, or system calibration manually before supplying data to the machine learning model or calibrating the DAC using the machine learning model. As such, the data or information library may also include the transfer function of a calibrated or partially calibrated DAC. Although data converter convention DC accuracy generally focuses on the data converter transfer function, most often end-point adjusted, the input and output data representation may also be a useful form of the same information for machine learning. As such, the data or information library may represent different DAC configurations and the resulting impact on transfer functions of these configurations. The data or information library may be generated using an iterative process, similar to that described in FIG. 7, by testing a large number of different DAC configurations to see the effects on DAC transfer function. Accessing the library may comprise the DAC retrieving the data or information library from a co-located memory. Alternatively, the accessing may take place off-chip, for example during the manufacturing process.

The data library can be generated from or using a sample DAC, for example a pre-production DAC system. Using a sample DAC system in this way allows real-world effects to be included in the data, for example data which a simulation may not capture. The data library may also include simulated data, which allows a data library to include a large quantity of data for a low cost. Data augmentation may also be used, where data acquired from real-world or sample DAC systems is augmented using, for example, simulation data.

The quality of the information or data library is important to the quality of the machine learning model developed. As such, a further optional step, step 808, in between steps 802 and 804 of FIG. 8*a* may check the data quality. Exploratory data analysis (EDA) may be used to check the quality, entropy and any assumptions, or bias, included in the library. Where the EDA confirms that the quality of the data is sufficient, the method may proceed to step 804. Where the EDA results in the data quality being deemed insufficient, the method may return to step 802 where new data may be received or data augmentation may be used.

Step 804 comprises performing a machine learning operation on the data or information library to determine the impact of DAC configuration on the transfer function of the DAC.

Step 806 comprises training the machine learning model using the provided data or information library. The machine learning model learns from the provided library and may be considered to embody or encompass the library, in that the machine learning model is tuned and improved by the provision of the data.

Steps 802 to 806 may be performed off-chip during an initial manufacturing process. It will be appreciated that digital processing may be implemented at different parts of the system design and may be divided into sub-parts completed in different parts of the system. This includes on-chip digital, multiple chip solutions and off-chip DSP including with micro-controllers, FPGAs and cloud processing. For example, a data or information library may be generated for a large number of DACs and machine learning used to analyse the effects of DAC configuration on the transfer function. From this, the trained machine learning model may be generated that associates the effects of DAC configuration on the transfer function of the DAC. The model may be provided to the control system of the DAC, for example saved in a memory of the control system, hard-coded into the design or may be configurable to allow for further or iterative optimization.

Alternatively, the steps 802-806 may be performed on-chip e.g. with initial random machine learning model coefficients and data or information library provided to the control system including in the calibration circuitry 608 of the DAC system 600. The control system of the DAC system 600 may then train the machine learning model.

Once the machine learning model has been trained, either off-chip and then provided to the control system of the DAC system 600, or using the control system of the DAC system 600, the machine learning model may be used to determine a DAC configuration for the transfer function modification circuitry.

FIG. 8*b* shows the determination of an optimal DAC configuration in method 810 after the machine learning model has been trained.

In step 812, the transfer function of the DAC is received by the control system of the calibration circuitry 608.

In step 814, the machine learning model is applied to the received transfer function to determine an optimal DAC configuration. A number of different configurations may be optimal for each DAC. For example, any configuration which provides a residual error below a threshold residual error may be considered optimal.

Optionally, once an optimal DAC configuration has been determined, it may be applied to the transfer function modification circuitry. Following the application of the DAC configuration, the machine learning model may receive a transfer function of the DAC in step 816. This received transfer function allows the calibration circuitry to determine the effect of the applied DAC configuration. The received transfer function may be determined by measuring an output of the DAC vs the input data.

In optional step 818, the machine learning model may use continuous learning based on the received updated transfer function from step 816. The machine learning model may be trained based on the effects of the applied DAC configuration. This allows the machine learning model to continuously improve, update and adapt to change.

Alternatively or additionally, in step 820, the system may iterate the DAC configuration by using the machine learning model to determine an updated optimal DAC configuration. Step 820 may be used where there is a large residual error between the initial transfer function of the DAC and the updated transfer function of the DAC. A large residual error may be a residual error above a residual error threshold of the DAC system.

Step 806 comprises determining an optimal configuration for a DAC based on the machine learning algorithm of step 804. This may comprise the control system selecting a DAC confirmation based on a transfer function of the DAC, a target transfer function, and the machine learning algorithm. The selected DAC configuration may be applied to the transfer function modification circuit.

When a DAC configuration has been selected and applied using the method of FIG. 7 or FIG. 8*b*, the system may be configured to test the performance and residual error of the DAC configuration.

The DAC 500 of FIG. 5 and DAC 600 of FIG. 6 may be included as part of a larger system or signal chain.

For example, as shown in FIG. 9, a signal chain 900 may include the DAC 600 of FIG. 6. The digital input provided to the DAC 600 may be pre-processed by circuitry 902. Circuitry 902 may include any number of systems, such as an amplifier or buffer. The analog output of the DAC 600 may be provided to circuitry 904 and post-processed. Circuitry 904 may also include any number of systems, such as an amplifier or buffer. Further components may result in non-linearity in the signal chain, such as voltage or current references supplied to the DAC. Buffering circuits may include range scaling and offset circuits. The signal chain 900, including circuitry 902, DAC 600 and circuitry 904, may have a signal chain transfer function, which introduces a non-linearity into the output. The non-linearity may be caused by the errors in the DAC 600, such as those caused by voltage errors at the plurality of nodes of an impedance network. However, non-linearity may also be introduced by circuitry 902 and circuitry 904. As such, when determining the trim code and demultiplexer 506 output, it may be desirable to linearise the transfer function of the signal chain 900 rather than the transfer function of the DAC 500, 600.

As such, the target transfer function of the DAC 500, 600 may be non-linear and determined such that it compensates for the non-linear effects of the signal chain 900, resulting in a transfer function of the signal chain 900 being linear. The target transfer function may also be non-linear.

The DAC 600 of FIG. 6 includes a single current DAC 504 and a single demultiplexer 506. However, the DAC may include a plurality of current DACs coupled to a plurality of demultiplexers.

FIG. 10 shows a DAC 1000 comprising a transfer function modification circuit 1002 including a plurality of current DACs, each current DAC comprising an input for receiving trim codes and an output. Each current DAC may receive a current reference. The current reference may be used by the current DACs to reference their provided output current relative to the trim code. All current DACs may receive the same current reference or a different current reference. The system further comprises a plurality of demultiplexers, each demultiplexer of the plurality of demultiplexers comprising an input and a plurality of outputs.

DAC 1000 includes a first current DAC 1004 with an input and an output. The output of the first current DAC 1004 is coupled to the input of a first demultiplexer 1006. DAC 1000 further includes a second current DAC 1010 with an input and an output. The output of the second current DAC 1010 is coupled to the input of a second demultiplexer 1012.

Calibration circuit 1008 is configured to provide a first trim code 1014 to the first current DAC 1004 and a second trim code 1016 to the second current DAC 1010. The calibration circuit is further configured to provide a first multiplexer select signal 1018 to the first demultiplexer 1006 and a second multiplexer select signal 1020 to the second demultiplexer 1012. The calibration circuit 1008 may determine the plurality of trim codes and select signals using the method 700 or 800 in the same way that it may be configured to determine a single trim code and select signal.

By having two demultiplexers 1006, 1012, the system may supply current to or drain current from two nodes of the plurality of nodes 404a-404i of the impedance network. This allows greater control over the transfer function of the DAC 1000 by coupling the trim currents to the points which optimize the impact of the currents on the transfer function.

The outputs of each demultiplexer are coupled to different nodes of the plurality of nodes 404a-404i. They may be connected to different numbers of nodes of the plurality of nodes or the same number of nodes.

Whilst the system of FIG. 10 includes two current DACs 1004, 1010 and two demultiplexers 1006, 1012, it may include more than two current DACs and more than two demultiplexers.

Each current DAC in DAC 1000 is coupled to a node of the plurality of nodes via a demultiplexer. However, the system may include additional current DACs which are connected to a single node of the plurality of nodes and are not coupled via demultiplexers. This may be beneficial where there are known nodes in the impedance network that commonly or regularly need adjusting.

FIG. 11 shows a DAC 1100 comprising a transfer function modification circuit 1102. In addition to the first current DAC 1004 and second current DAC 1010, the DAC 1100 includes a third current DAC 1122 and a fourth current DAC 1124.

An impedance network used in a string DAC may be coupled at a first end to a reference voltage terminal Vref, and at a second end to a second reference voltage terminal, which may be ground. The impedance network may be coupled to the reference voltage Vref through a variable resistor 1126. The variable resistor 1126 allows headroom to be created and varied between the voltage reference and the first end of the impedance network. Similarly, the impedance network may be coupled to the second reference voltage through a second variable resistor 1128.

The output of the third current DAC 1122 is coupled to a node 404a of the impedance network. Node 404a may be an end-point of the impedance network, such that it is coupled to the reference voltage. Node 404a is coupled to the reference voltage through the variable resistor 1126. The third current DAC 1122 is therefore an end-point trim DAC. The third current DAC 1122 is arranged to receive a trim code 1130 from calibration circuitry 1008. Based on the value of the trim code 1130, the third current DAC 1122 will source or sink current from node 404a, providing end-point calibration to the circuit.

Similarly, the fourth current DAC 1124 is arranged to receive a trim code 1132 from calibration circuitry 1008. The fourth current DAC 1124 is an end-point current DAC configured to provide endpoint calibration for node 404i of the impedance network.

Whilst DACs may be directly coupled to nodes to provide end point calibration, they may also be coupled directly to nodes in other parts of the impedance network. For example, it may be determined that certain nodes of the impedance network regularly require current injection to provide a desired transfer function. A dedicated current DAC may be coupled or directly connected to this node. This current DAC may be calibrated in the same way as the DAC-demultiplexer combination as described in method 700. However, as will be clear to the skilled person, no demultiplexer output needs to be selected as in step 702, and instead only a trim code for the DAC needs to be selected.

The transfer function modification circuitry described in the preceding figures may be applied to any DAC system which uses an impedance network comprising a plurality of resistors coupled together by nodes, such as the string DAC of FIG. 2 or the R-2R DAC of FIG. 3. The transfer function modification circuit may also be applied to more complex DACs which include multiple impedance networks.

The binary string DAC shown in FIG. 2a includes $2^N$ series connected resistors, where N is the length of the binary digital input word. Alternative numbers of resistors may be used, such as $2^N-1$ resistors shown in FIG. 2b. Other configurations with different numbers of resistors may also be used. For moderate and high-resolution DACs, this requires a large resistor string and a large system area. Combining the space saving demultiplexer compensation system shown in FIGS. 5 and 6 with an alternative DAC impedance network design allows the size of the DAC system to be reduced in size even further, whilst still allowing compensation and calibration.

FIG. 12 shows a DAC 1200. DAC 1200 includes a plurality of impedance networks. The DAC 1200 is an N bit DAC, capable of receiving an input digital code word of N bits. The digital word may be considered as a segmented DAC input comprising M least significant bits and N-M most significant bits. A segmented DAC is a DAC which divides the DAC word into multiple segments e.g. for multiple impedance string DACs, with one string converting the MSBs of the DAC and one string converting the LSBs of the DAC. There are many known types of segmented DAC, and as such they will not be described in detail here. One example of a segmented DAC is shown in FIG. 12, however, the transfer function modification applied to the segmented DAC of FIG. 12 may also be applied to other segmented DACs.

A first impedance network 10 includes resistors Ra1 to Ra2$^{N/2}$−1. A second impedance network 12 includes a resistors Rb1 to Rb2$^{N/2}$−1. The first 10 and second 12 impedance networks are most significant bit, MSB, impedance networks. The first impedance network 10 is coupled to a first reference voltage V$_{ref}$+ and the second impedance network 12 is coupled to a second reference voltage V$_{ref}$−. The DAC 1200 also includes a third impedance network 40 comprising resistors Rc1 to Rc2$^{N/2}$−1. The third impedance network is a least significant bit or LSB impedance network. DAC 1200 is a tri-string DAC. The first and second impedance networks are also coupled to high impedance nodes or terminals, or floating terminals. Both strings are preferably implemented so that resistors in both strings match within the strings and between both strings. Hence, there are corresponding impedance elements and node in both the first and second impedance networks, coupled together in series with the end nodes terminated at high impedance nodes. As such, the first or bottom nodes of both strings correspond to each other, and so on up the string all the way to other end of both strings.

Each impedance network is coupled to a respective plurality of switches Sa, Sb and Sc. These switches are controlled using a decoder with dependence on the input digital code. An analog output is provided at output node 24.

U.S. Pat. No. 6,416,616 B1 provides an explanation of the working of the tri-string DAC as shown in FIG. 12 and is incorporated by reference in its entirety here. Tri-string DACs are well known in the art and the working of DAC 1200 will not, therefore, be described in extensive detail here.

Similar to the impedance networks described for single string DACs, voltage errors can appear at the nodes connecting the resistors of the first impedance network 10 and the second impedance network 12. As such, currents may be injected into these nodes using a transfer function modification circuit in a similar way to that described for the preceding DACs.

FIG. 13 shows a DAC 1300. The DAC 1300 includes the tri-string DAC shown in FIG. 12 and a transfer function modification circuit 1302. The transfer function modification circuit includes calibration circuitry 1308 and a plurality of current DACs 1304, 1310 and multiplexers 1306, 1312.

Transfer function modification circuit 1302 comprises a first current DAC 1304. An output of the first current DAC 1304 is coupled to the input of a demultiplexer 1306. The plurality of outputs of the demultiplexer 1306 are coupled to nodes of the plurality of nodes of the first impedance network 10.

Transfer function modification circuit 1302 comprises a second current DAC 1310. An output of the second current DAC 1310 is coupled to the input of a demultiplexer 1312. The plurality of outputs of the demultiplexer 1312 are coupled to nodes of the plurality of nodes of the second impedance network 12. Whilst this figure includes two DACs, one DAC or more than two DACs may be used.

The current DACs 1304, 1310 receive respective digital input condes 1314, 1315 from calibration circuitry 1308. The demultiplexers 1306, 1312 receive respective select signals 1318, 1320 from the calibration circuitry 1308.

As such, the transfer function modification circuit 1302 includes a plurality of multiplexers and a plurality of current DACs arranged to inject current into or drain current from a plurality of nodes in a plurality of impedance networks.

Whilst the transfer function modification circuit 1302 of FIG. 13 includes two current DACs and two demultiplexers, the transfer function modification circuit 1302 may include a plurality of current DACs and multiplexers. Alternatively, it may include one current DAC and one demultiplexer, with the outputs of the single demultiplexer coupled to nodes in one or both of the first impedance network 10 and the second impedance network 12.

The first impedance network 10 and the second impedance network 12 include the same number of resistors (2$^{N/2}$−1) in this binary example implementation. As noted previously, impedance networks used in DACs may include a different number of resistors, such as 2$^N$. Implementations that are not binary may also use different numbers of resistors. As such, the impedance networks include the same number of nodes connecting the resistors. The first impedance network 10 and the second impedance network 12 differ only in that they are coupled to different reference voltages. As such, the first impedance network 10 and second impedance network 12 have corresponding resistors and nodes. For example, the first resistor Ra1 corresponds to resistor Rb1, the second resistor Ra2 corresponds to resistor Rb2. Similarly, the node between resistors Ra1 and Ra2 corresponds to the node between resistors Rb1 and Rb2. As such, nodes in the first impedance network and nodes in the second impedance network. The output of a demultiplexer may be coupled to nodes in both the first impedance network 10 and the second impedance network 12, as errors may appear in both the impedance networks.

The nodes of the first impedance network 10 that the demultiplexer 1306 is coupled to may correspond to nodes of the second impedance network 12 that the second demultiplexer is coupled to. This current to be inject into or drained from corresponding nodes in both the first impedance network 10 and the second impedance network 12.

The voltage reference terminals described with respect to the preceding figures are normally coupled to voltage sources, or voltage levels, but a reference level may also be provided via a current source e.g. using a voltage to current converter circuit which may use the same type of impedance element to make the current track impedance variations.

Whilst a MOS implementation is described, it will be appreciated that BiCMOS implementations can also be used, including using bipolar and/or JFET devices.

Alternative trim DAC implementations may also be used e.g. using resistor degeneration. Cascode devices may also be used, not included here for clarity of the explanation.

The impedance networks in the DACs described in this application include a plurality of resistors coupled in series. However, rather than resistors the impedance networks may use alternative impedance components or elements, such as switched capacitors.

Various modifications whether by way of addition, deletion, or substitution of features may be made to the above described examples to provide further examples, any and all of which are intended to be encompassed by the appended claims.

Aspects

Included Below are a Plurality of Aspects of the Invention
    1. A digital-to-analog converter, DAC, comprising:
        an impedance network, comprising a plurality of impedance elements coupled together via a plurality of nodes, wherein the impedance network is configured to be coupled to a reference voltage and to generate a plurality of voltage values at the plurality of nodes; and a transfer function modification circuit, comprising:

a trim current DAC, the trim current DAC comprising an input for receiving trim codes and an output; and a demultiplexer, the demultiplexer comprising an input and a plurality of outputs, wherein the output of the trim current DAC is coupled to the input of the demultiplexer, wherein each output of the plurality of outputs of the demultiplexer is coupled to a respective node of the plurality of nodes, and wherein the trim current DAC is configured to modify the transfer function of the DAC by injecting current into, or draining current from, a selected node of the plurality of nodes via a selected output of the demultiplexer.

2. The DAC according to aspect 1, wherein the transfer function modification circuit further comprises calibration circuitry configured to supply a trim code to the trim current DAC and select the demultiplexer configuration to modify the transfer function of the DAC.

3. The DAC according to aspect 2, wherein the calibration circuitry selects the trim code and the demultiplexer configuration to reduce the difference between a transfer function of the DAC and a target transfer function of the DAC.

4. The DAC according to aspect 2 or aspect 3, wherein the calibration circuitry is configured to select the trim code and select the demultiplexer configuration by:

testing a plurality of configurations for the transfer function modification circuit, wherein a configuration is a combination of the trim code and the demultiplexer configuration.

5. The DAC according to aspect 4, wherein testing a plurality of configurations for the transfer function modification circuit comprises repeating:

selecting demultiplexer configuration;

selecting a trim code for the DAC;

determining a residual error between a transfer function of the DAC and the target transfer function for the configuration.

6. The DAC according to aspect 5, wherein selecting the output of the demultiplexer and the trim code for the trim DAC comprises:

comparing the residual errors of the plurality of configurations;

applying the configuration with the lowest residual error measured.

7. The DAC according to aspect 5, wherein selecting the output of the demultiplexer and the trim code for the trim DAC comprises:

repeating the steps of claim 5 until a determined residual error is less than a specified residual error;

applying the configuration with the determined residual error that is less than the specified residual error.

8. The DAC according to any of aspects 5–7, wherein:

selecting the output of the demultiplexer and selecting the trim code for the DAC comprises selecting from a data library of demultiplexer outputs and trim codes.

9. The DAC according to aspect 3, wherein the calibration circuitry is configured to select the trim code and select the output of the demultiplexer by:

selecting the trim code and the output of the demultiplexer from a data library based on the transfer function of the DAC and the target transfer function.

10. The DAC according to aspect 3, wherein the calibration circuitry is configured to select the trim code and select the output of the demultiplexer by:

receiving a transfer function of the DAC and a target transfer function of the DAC;

performing a machine learning operation using a machine learning model to determine an optimal DAC configuration;

applying the optimal DAC configuration.

11. The DAC according to any of aspects 3–10, wherein the target transfer function is a linear relationship between an input of the DAC and an output of the DAC.

12. The DAC according to any of aspects 3–10, wherein the target transfer function is a non-linear relationship between an input of the DAC and an output of the DAC.

13. The DAC according to any preceding aspect, further comprising:

a plurality of trim current DACs, each trim current DAC of the plurality of trim current DACs comprising an input for receiving trim codes and an output;

a plurality of demultiplexers, each demultiplexer of the plurality of demultiplexers comprising an input and a plurality of outputs;

wherein the output of each trim current DAC is coupled to the input of a respective demultiplexer, wherein each output of the plurality of outputs of each demultiplexer is coupled to a respective node of the plurality of nodes, and wherein each of the plurality of trim current DACs are configured to modify the transfer function of the DAC by injecting current into, or draining current from, a selected node of the plurality of nodes via a selected output of each demultiplexer.

14. The DAC according to any preceding aspect, further comprising an additional trim current DAC, the additional trim current DAC comprising an output, wherein the output is coupled to a node of the plurality of nodes of the impedance network.

15. The DAC according to aspect 14, wherein the trim DAC is coupled to an endpoint of the impedance network and configured to provide endpoint calibration.

16. The DAC according to any preceding aspect, wherein the DAC comprises a string DAC.

17. The DAC according to aspect 16, further comprising:

a second impedance network comprising a second plurality of resistor elements coupled together via a second plurality of nodes, wherein the second impedance network is configured to be coupled to a second reference voltage and to generate a plurality of voltage values at the second plurality of nodes, wherein each node of the second plurality of nodes corresponds to a node of the first plurality of nodes; and wherein each output of the plurality of outputs of the demultiplexer is coupled to a respective node of the second plurality of nodes that corresponds to a respective node of the first plurality of nodes.

18. The DAC according to any of aspects 1–15, wherein the DAC comprises a ladder DAC.

19. The DAC according to any preceding aspect, wherein the DAC is configured to select an output node from the plurality of nodes, to generate an analog output voltage.

20. The DAC according to any preceding aspect, wherein the trim current DAC and demultiplexer are incorporated within a single integrated circuit.

21. A digital-to-analog converter, DAC, comprising:
   an impedance network, comprising a plurality of impedance elements coupled together via a plurality of nodes, wherein the impedance network is configured to be coupled to a reference voltage and to generate a plurality of voltage values at the plurality of nodes; and
   a transfer function modification circuit, comprising:
      current injection means, the current injection means configured to be coupled to a subset of the plurality of nodes;
      wherein the current injection means is configured to modify the transfer function of the DAC by selecting a node of the subset of the plurality of nodes and injecting current into, or draining current from, the selected node of the subset of the plurality of nodes.

22. The DAC according to aspect 21, wherein the current injection means comprises the functionality of a trim current DAC and a demultiplexer.

23. A method of modifying the transfer function of a digital-to-analog converter (DAC) comprising an impedance network, the impedance network comprising a plurality of resistor elements coupled together via a plurality of nodes, wherein the impedance network is configured to be coupled to a reference voltage and to generate a plurality of voltage values at the plurality of nodes, the method comprising:
   selecting a respective node of the plurality of nodes to inject current into, or drain current from;
   injecting the current into, or draining the current from, the selected node of the impedance string to modify the transfer function of the DAC.

24. The method according to aspect 23, wherein selecting a respective node of the plurality of nodes to inject current into, or drain current from comprises:
   receiving a data library comprising characterisations of a number of DACs;
   providing the data library to a machine learning model;
   training the machine learning model using the data library.

25. The method according to aspect 24, further comprising:
   receiving a transfer function of the DAC and a target transfer function of the DAC;
   performing a machine learning operation using the machine learning model to determine an optimal DAC configuration, the optimal DAC configuration comprising a selected node of the plurality of nodes to inject current into, or drain current from;
   applying the optimal DAC configuration 26. The method according to aspect 25, the method further comprising:
   receiving an updated transfer function of the DAC following applying the optimal DAC configuration; and
   training the machine learning model based on the effect of the optimal DAC configuration on the updated transfer function.

27. The method according to aspect 25, further comprising:
   receiving an updated transfer function of the DAC following applying the optimal DAC configuration; and
   iterating the DAC configuration using the machine learning model to determine an updated optimal DAC configuration.

28. The method according to aspect 23, wherein selecting a respective node of the plurality of nodes to inject current into, or drain current from comprises:
   testing a plurality of DAC configurations by:
      selecting a respective node of the plurality of nodes to inject current into, or drain current from;
      determining a residual error between a transfer function of the DAC and the target transfer function for the configuration;
   comparing the residual errors of the plurality of configurations;
   applying the configuration with the lowest residual error.

29. A method of modifying the transfer function of a digital-to-analog converter (DAC) comprising an impedance network, the method comprising:
   receiving a data library of DAC configurations applied to provide a target transfer function to the DAC;
   performing a machine learning operation on the data library to determine machine learning model relating DAC configurations and target transfer functions;
   selecting a DAC configuration using the machine learning model and a target transfer function for the DAC;
   applying the selected DAC configuration to the DAC.

The invention claimed is:

1. A digital-to-analog converter, DAC, comprising:
   an impedance network, comprising a plurality of impedance elements coupled together via a plurality of nodes, wherein the impedance network is configured to be coupled to a reference voltage and to generate a plurality of voltage values at the plurality of nodes; and
   a transfer function modification circuit, comprising:
   a trim current DAC, the trim current DAC comprising an input for receiving trim codes and an output; and
   a demultiplexer, the demultiplexer comprising an input and a plurality of outputs,
   wherein the output of the trim current DAC is coupled to the input of the demultiplexer,
   wherein each output of the plurality of outputs of the demultiplexer is coupled to a respective node of the plurality of nodes, and
   wherein the trim current DAC is configured to modify the transfer function of the DAC by injecting current into, or draining current from, a selected node of the plurality of nodes via a selected output of the demultiplexer.

2. The DAC according to claim 1, wherein the transfer function modification circuit further comprises calibration circuitry configured to supply a trim code to the trim current DAC and select the demultiplexer configuration to modify the transfer function of the DAC.

3. The DAC according to claim 2, wherein the calibration circuitry is configured to select the trim code and the demultiplexer configuration to reduce a difference between a transfer function of the DAC and a target transfer function of the DAC.

4. The DAC according to claim 2, wherein the calibration circuitry is configured to select the trim code and select the demultiplexer configuration by:

testing a plurality of configurations for the transfer function modification circuit, wherein a configuration is a combination of the trim code and the demultiplexer configuration.

5. The DAC according to claim 4, wherein testing a plurality of configurations for the transfer function modification circuit comprises repeating:

selecting demultiplexer configuration;

selecting a trim code for the DAC;

determining a residual error between a transfer function of the DAC and a target transfer function for the configuration.

6. The DAC according to claim 5, wherein selecting an output of the demultiplexer and the trim code for the trim DAC comprises:

comparing the residual errors of the plurality of configurations;

applying the configuration with a lowest residual error.

7. The DAC according to claim 5, wherein selecting the output of the demultiplexer and the trim code for the trim DAC comprises:

repeating operations of claim 5 until a determined residual error is less than a specified residual error;

applying the configuration with the determined residual error that is less than the specified residual error.

8. The DAC according to claim 5, wherein:

selecting the output of the demultiplexer and selecting the trim code for the DAC comprises selecting from a data library of demultiplexer outputs and trim codes.

9. The DAC according to claim 3, wherein the calibration circuitry is configured to select the trim code and select the output of the demultiplexer by:

receiving a transfer function of the DAC and a target transfer function of the DAC;

performing a machine learning operation using a machine learning model to determine an optimal DAC configuration;

applying the optimal DAC configuration.

10. The DAC according to claim 3, wherein a target transfer function is a linear relationship between an input of the DAC and an output of the DAC.

11. The DAC according to claim 2, wherein a target transfer function is a non-linear relationship between an input of the DAC and an output of the DAC.

12. The DAC according to claim 1, further comprising:

a plurality of trim current DACs, each trim current DAC of the plurality of trim current DACs comprising an input for receiving trim codes and an output;

a plurality of demultiplexers, each demultiplexer of the plurality of demultiplexers comprising an input and a plurality of outputs;

wherein the output of each trim current DAC is coupled to the input of a respective demultiplexer, wherein each output of the plurality of outputs of each demultiplexer is coupled to a respective node of the plurality of nodes, and wherein each of the plurality of trim current DACs are configured to modify the transfer function of the DAC by injecting current into, or draining current from, a selected node of the plurality of nodes via a selected output of each demultiplexer.

13. The DAC according to claim 1, further comprising an additional trim current DAC, the additional trim current DAC comprising an output, wherein the output is coupled to a node of the plurality of nodes of the impedance network.

14. The DAC according to claim 1, further comprising:

a second impedance network comprising a second plurality of resistor elements coupled together via a second plurality of nodes, wherein the second impedance network is configured to be coupled to a second reference voltage and to generate a plurality of voltage values at the second plurality of nodes, wherein each node of the second plurality of nodes corresponds to a node of the plurality of nodes of the impedance network; and wherein each output of the plurality of outputs of the demultiplexer is coupled to a respective node of the second plurality of nodes that corresponds to a respective node of the plurality of nodes.

15. The DAC according to claim 1, wherein the trim current DAC and demultiplexer are incorporated within a single integrated circuit.

16. A digital-to-analog converter, DAC, comprising:

an impedance network, comprising a plurality of impedance elements coupled together via a plurality of nodes, wherein the impedance network is configured to be coupled to a reference voltage and to generate a plurality of voltage values at the plurality of nodes; and a transfer function modification circuit, comprising:

current injection means, the current injection means configured to be coupled to a subset of the plurality of nodes;

wherein the current injection means is configured to modify the transfer function of the DAC by selecting a node of the subset of the plurality of nodes and injecting current into, or draining current from, the selected node of the subset of the plurality of nodes.

17. The DAC according to claim 16, wherein the current injection means comprises the functionality of a trim current DAC and a demultiplexer.

18. A method of modifying a transfer function of a digital-to-analog converter (DAC) comprising an impedance network, the impedance network comprising a plurality of resistor elements coupled together via a plurality of nodes, wherein the impedance network is configured to be coupled to a reference voltage and to generate a plurality of voltage values at the plurality of nodes, the method comprising:

selecting a respective node of the plurality of nodes to inject current into, or drain current from;

injecting the current into, or draining the current from, the selected node of the impedance network to modify the transfer function of the DAC.

19. The method according to claim 18, wherein selecting a respective node of the plurality of nodes to inject current into, or drain current from comprises:

receiving a data library comprising characterisations of a number of DACs;

providing the data library to a machine learning model;

training the machine learning model using the data library.

20. The method according to claim 19, further comprising:

receiving a transfer function of the DAC and a target transfer function of the DAC;

performing a machine learning operation using the machine learning model to determine an optimal DAC configuration, the optimal DAC configuration comprising a selected node of the plurality of nodes to inject current into, or drain current from;

applying the optimal DAC configuration.

* * * * *